United States Patent [19]
Endoh et al.

[11] Patent Number: 5,386,422
[45] Date of Patent: Jan. 31, 1995

[54] ELECTRICALLY ERASABLE AND PROGRAMMABLE NON-VOLATILE MEMORY SYSTEM WITH WRITE-VERIFY CONTROLLER USING TWO REFERENCE LEVELS

[75] Inventors: Tetsuo Endoh, Yokohama; Riichiro Shirota, Kawasaki; Kazunori Ohuchi; Ryouhei Kirisawa, both of Yokohama; Seiichi Aritome, Kawasaki; Tomoharu Tanaka, Yokohama; Yoshiyuki Tanaka, Tokyo, all of Japan

[73] Assignee: Kabushiki Kaisha Toshiba, Kawasaki, Japan

[21] Appl. No.: 229,761

[22] Filed: Apr. 19, 1994

Related U.S. Application Data

[63] Continuation of Ser. No. 851,286, Mar. 12, 1992, Pat. No. 532,699.

[30] Foreign Application Priority Data

Mar. 12, 1991 [JP] Japan .................................. 3-72424

[51] Int. Cl.[6] ............................................ G01R 31/28
[52] U.S. Cl. ................................... 371/21.5; 371/21.4; 365/201
[58] Field of Search .................... 371/21.1, 21.2, 21.4, 371/21.5, 21.6, 28; 365/184, 185, 200, 201, 900

[56] References Cited

FOREIGN PATENT DOCUMENTS 62-188100   8/1987   Japan.
1-46949    10/1989   Japan.
2092145A    3/1980   United Kingdom.

Primary Examiner—Vincent P. Canney
Attorney, Agent, or Firm—Oblon, Spivak, McClelland, Maier & Neustadt

[57] ABSTRACT

An EEPROM includes an array of memory cell transistors, which is divided into cell blocks each including NAND cell units of series-connected cell transistors. A sense amplifier is connected to bit lines and a comparator. A data-latch circuit is connected to the comparator, for latching a write-data supplied from a data input buffer. After desired cell transistors selected for programming in a selected block are once programmed, a write-verify operation is performed. The comparator compares the actual data read from one of the programmed cell transistors with the write-data, to verify its written state. The write-verify process checks the resulting threshold voltage for variations using first and second reference voltages defining the lower-limit and upper-limit of an allowable variation range. If the comparison results under employment of the first voltage shows that an irregularly written cell transistor remains with an insufficient threshold voltage which is so low as to fail to fall within the range, the write operation continues for the same cell transistor. If the comparison results under employment of the second voltage shows that an excess-written cell transistor remains, the block is rendered "protected" at least partially.

2 Claims, 15 Drawing Sheets

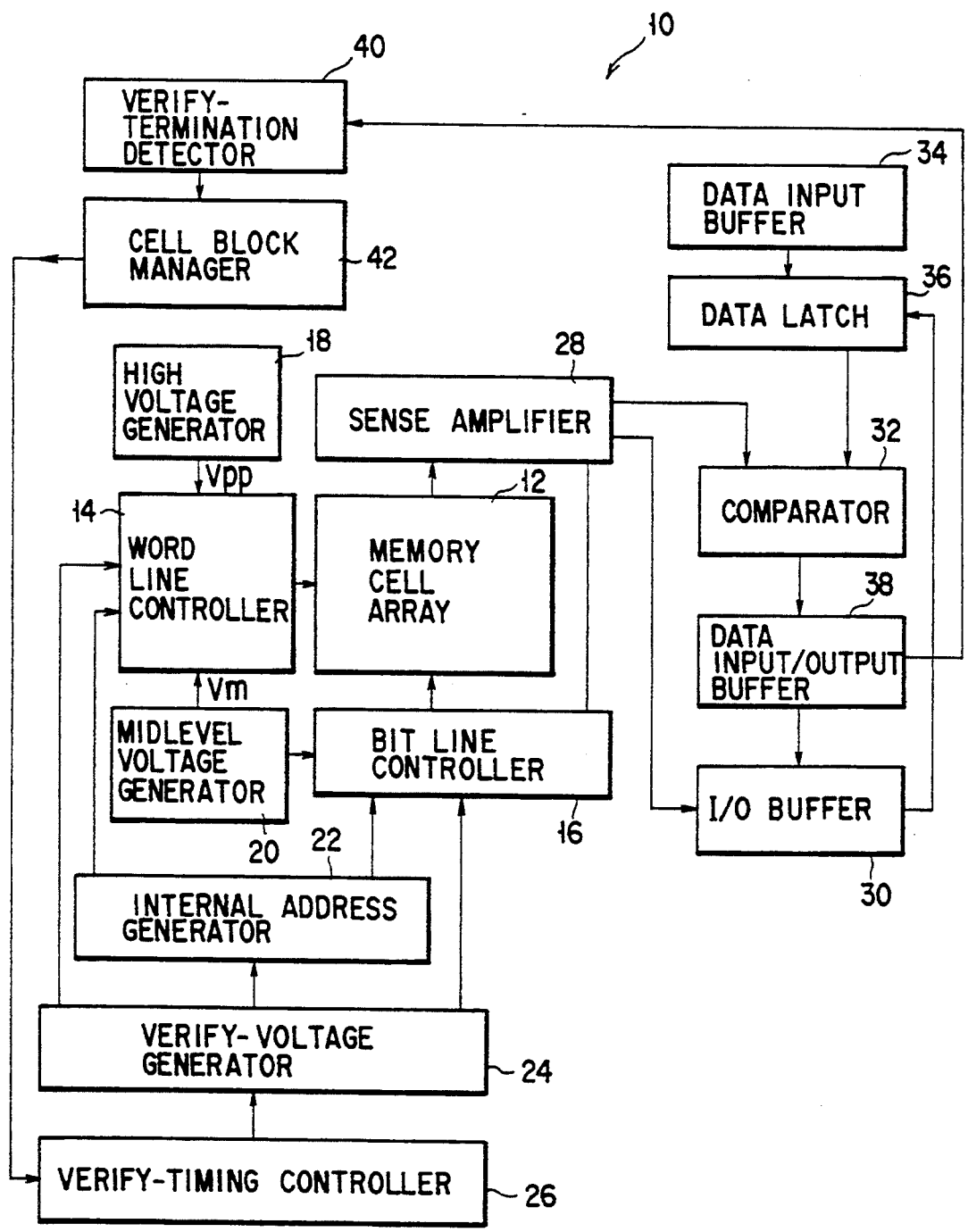
F I G. 1

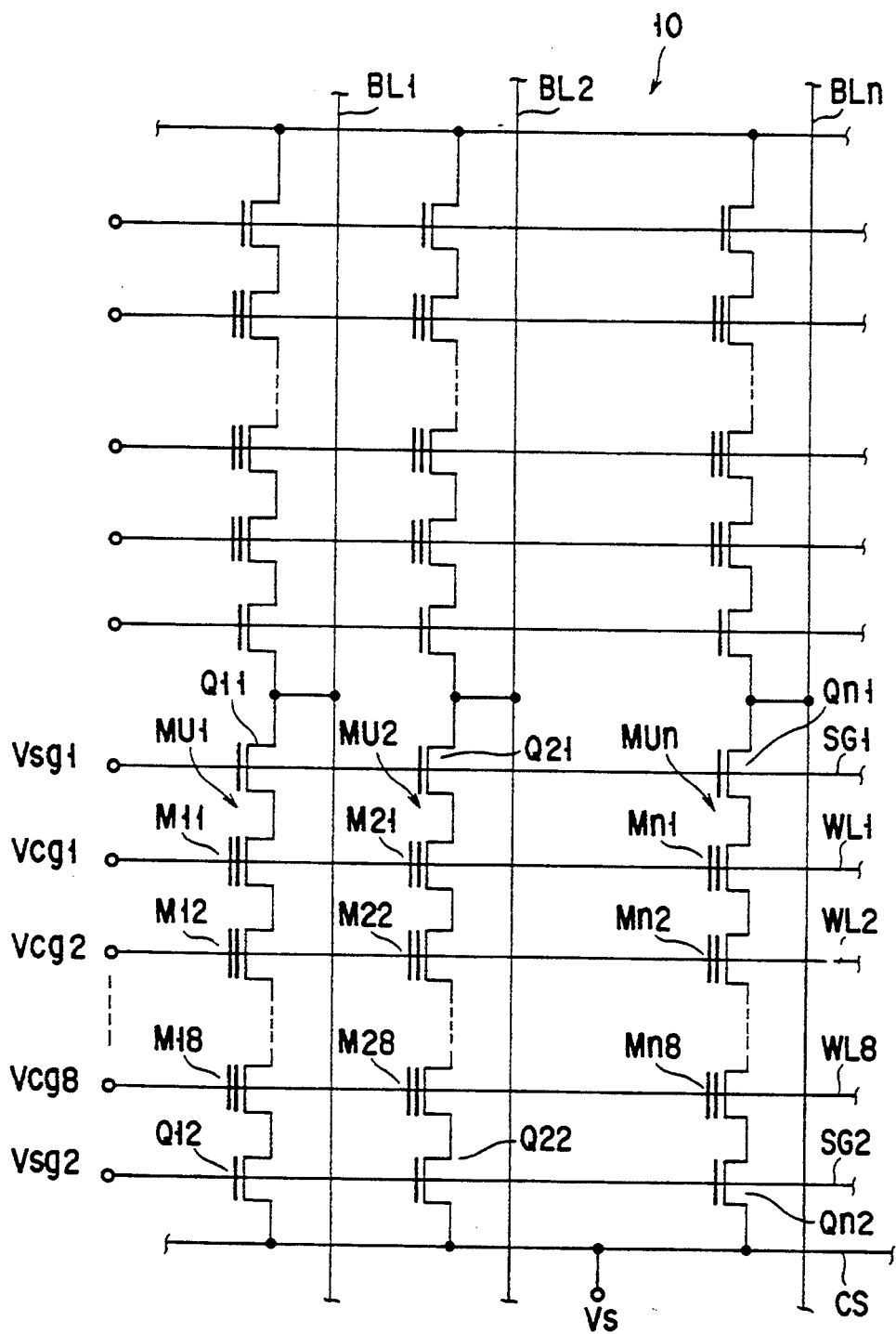
F I G. 2

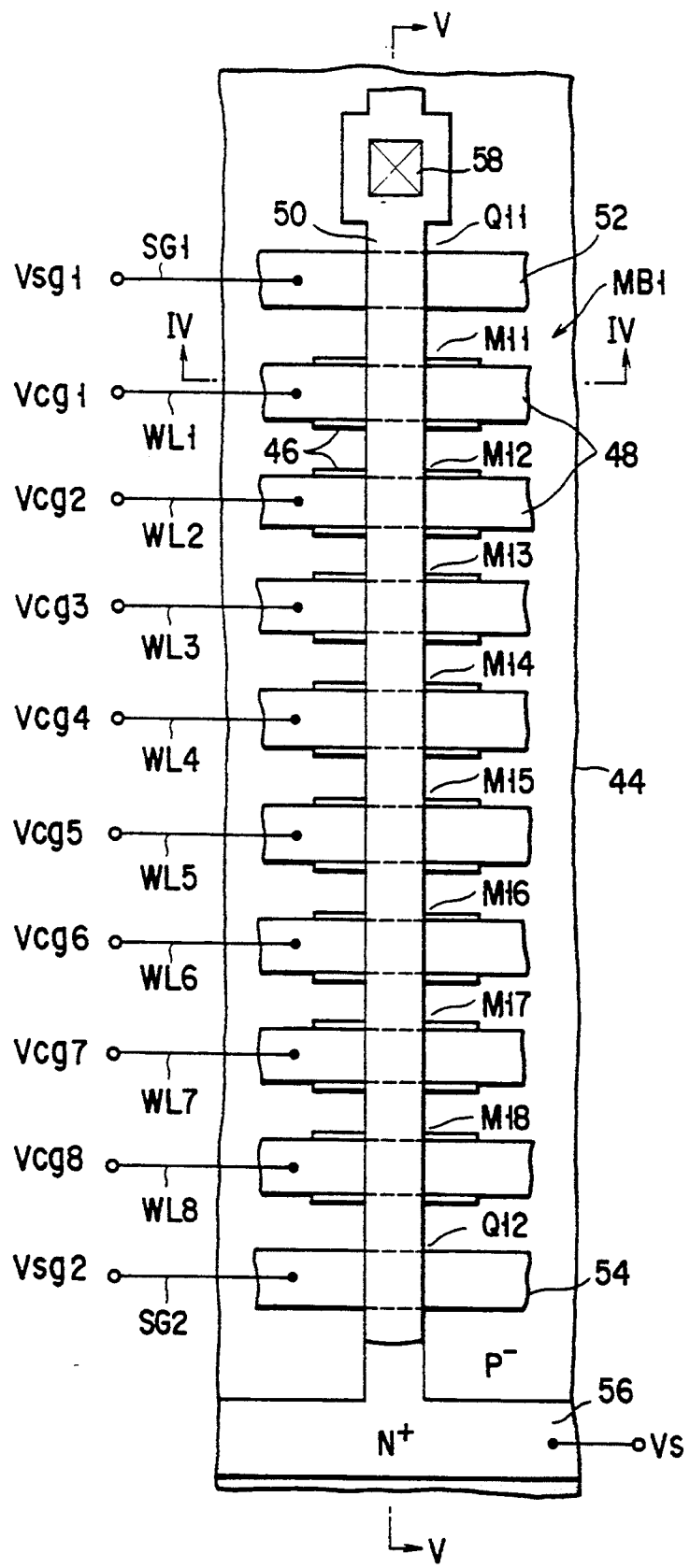
F I G. 3

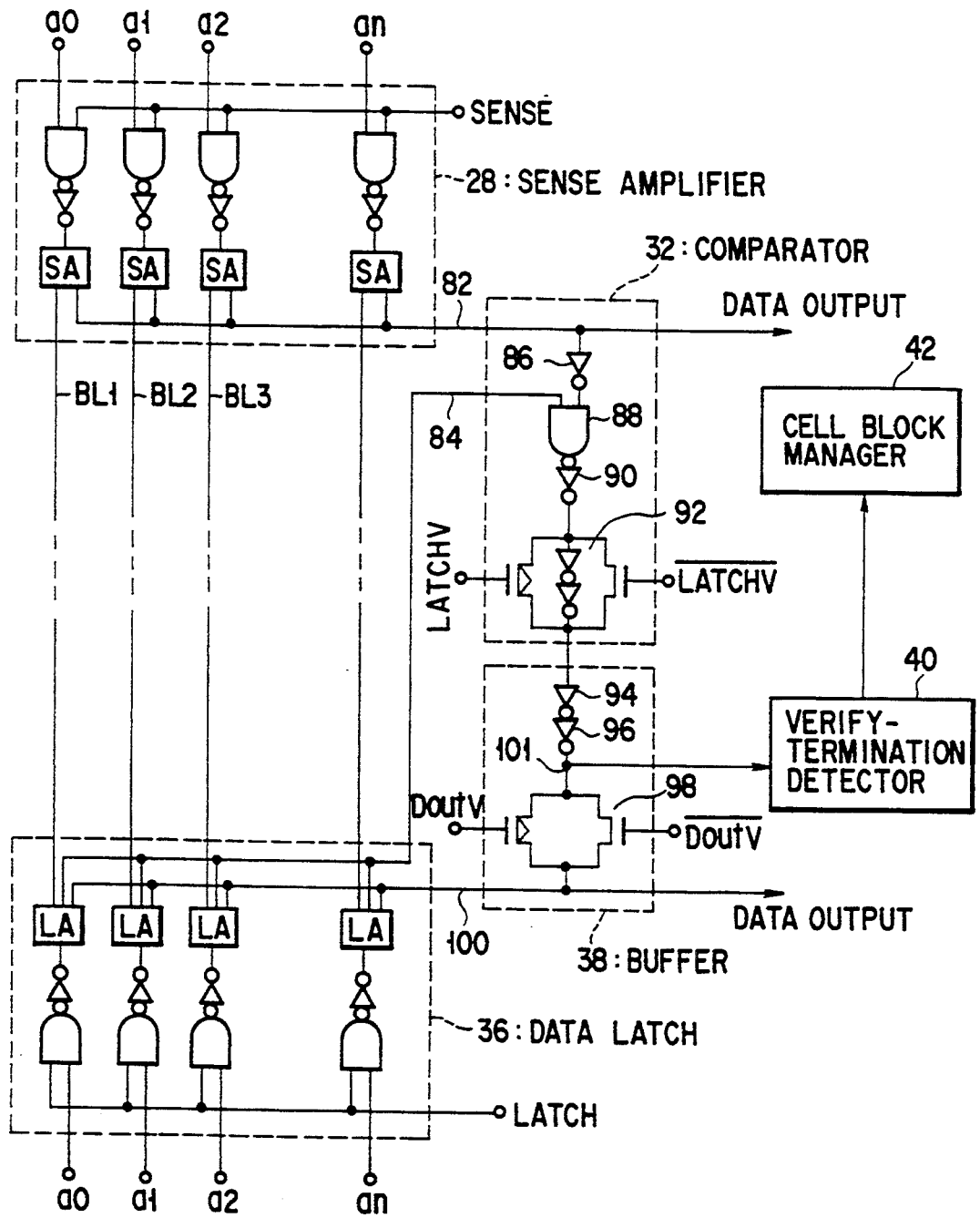
F I G. 6

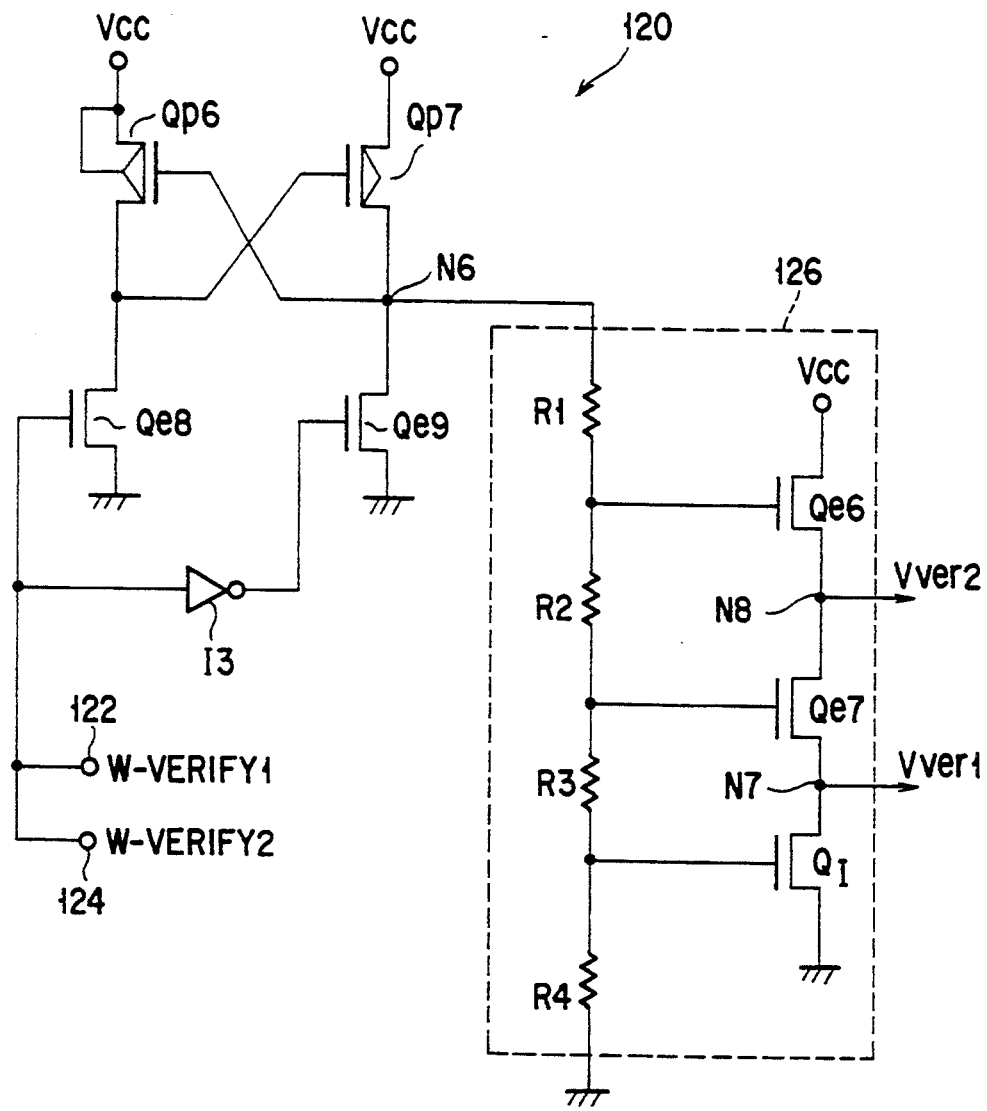
F I G. 8

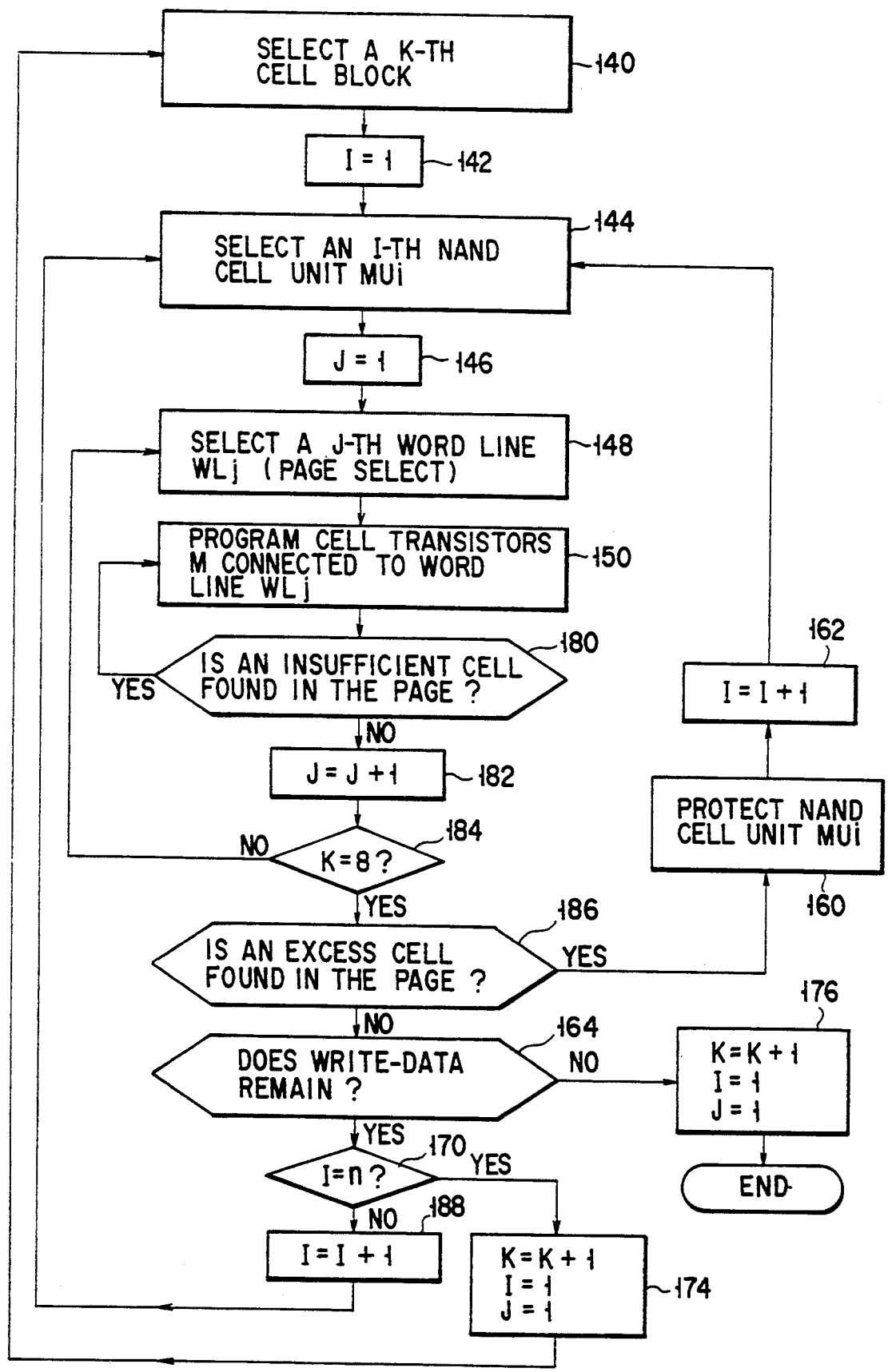
F I G. 13

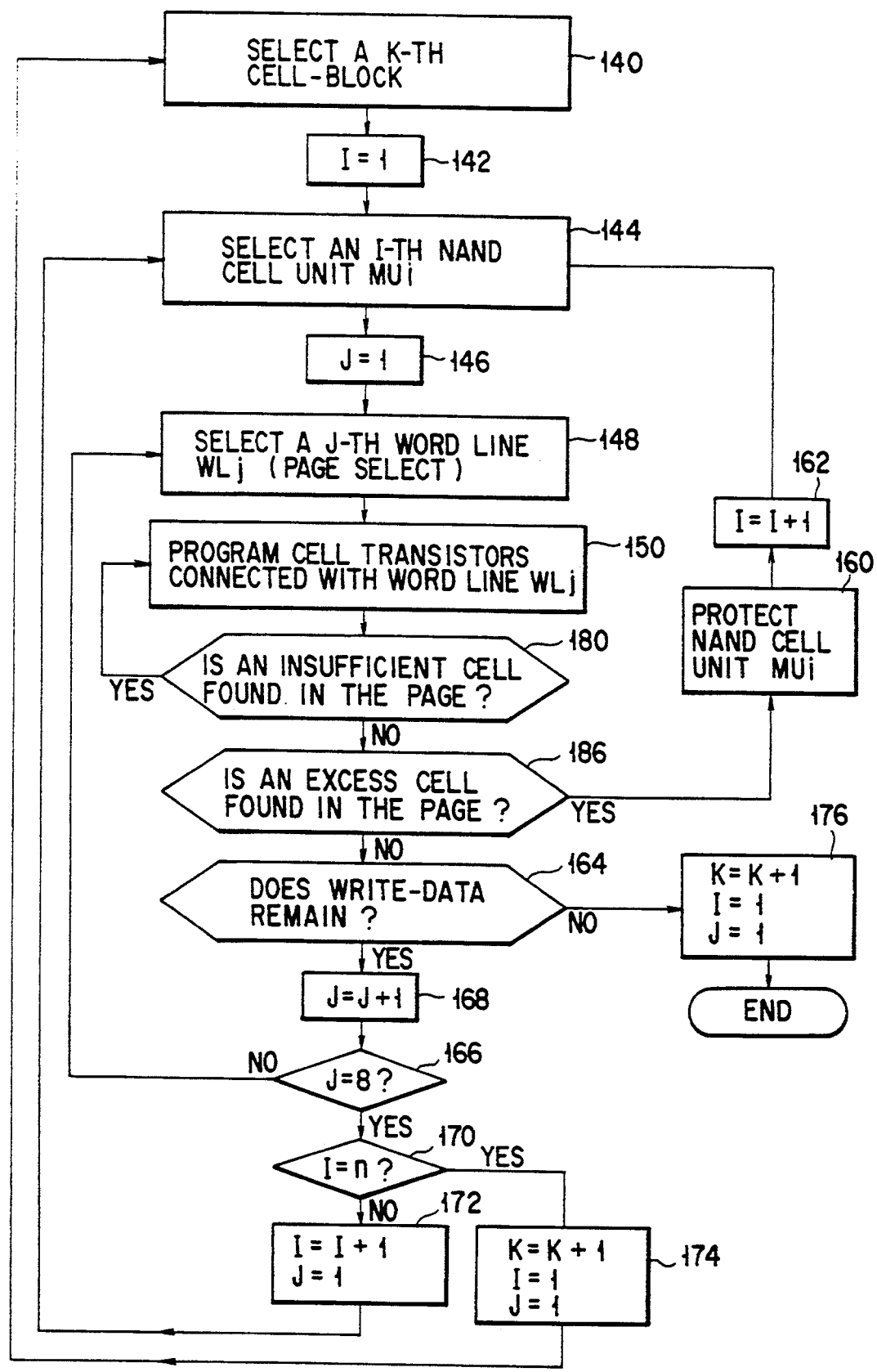
F I G. 14

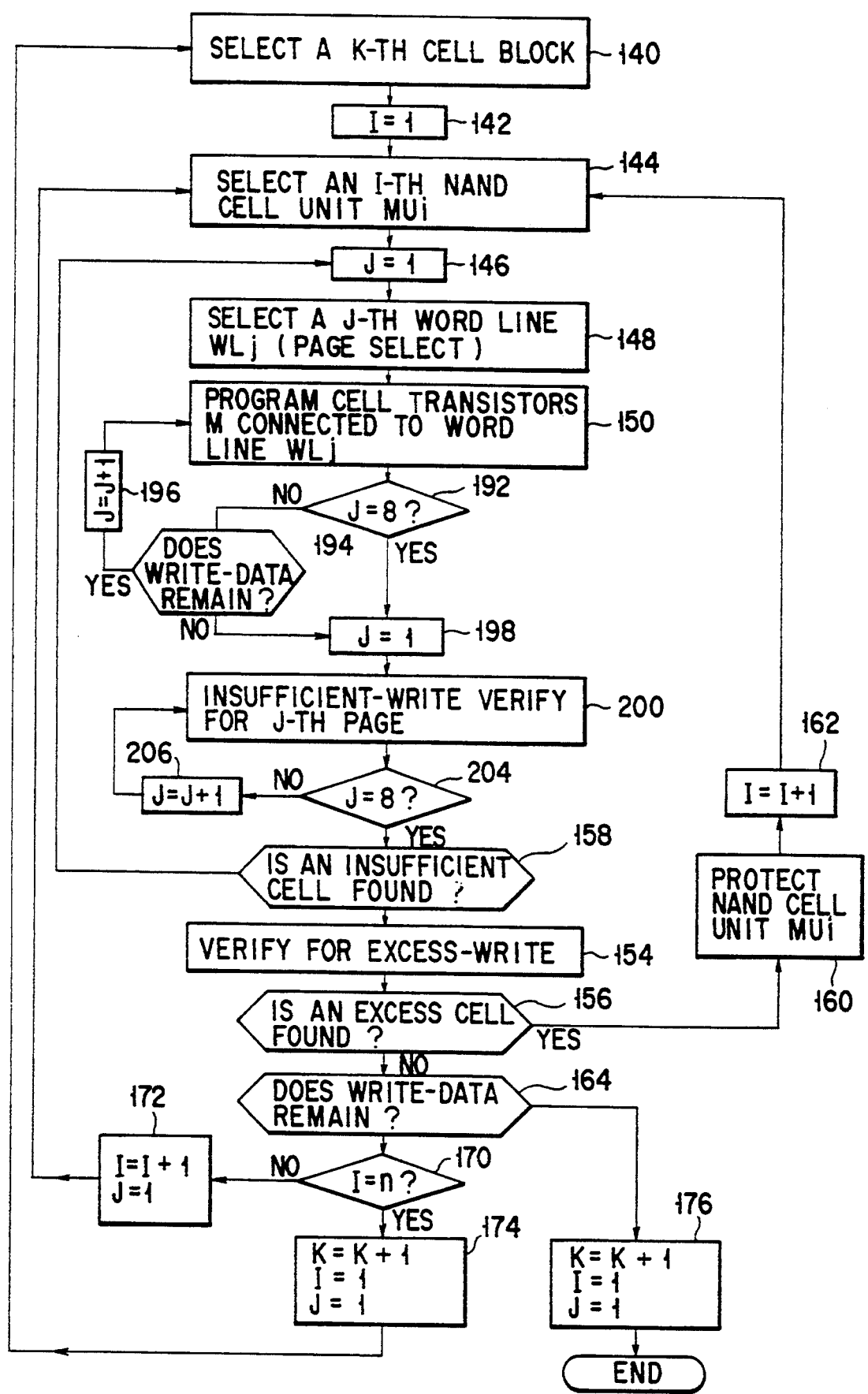
F I G. 16

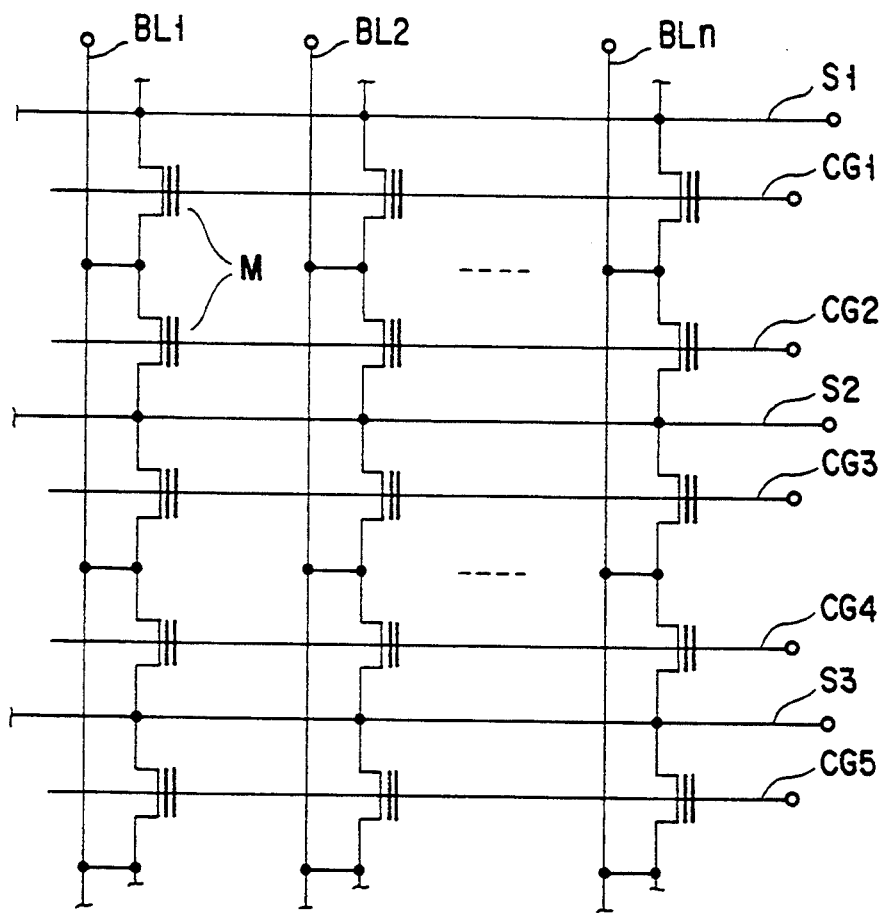
F I G. 17
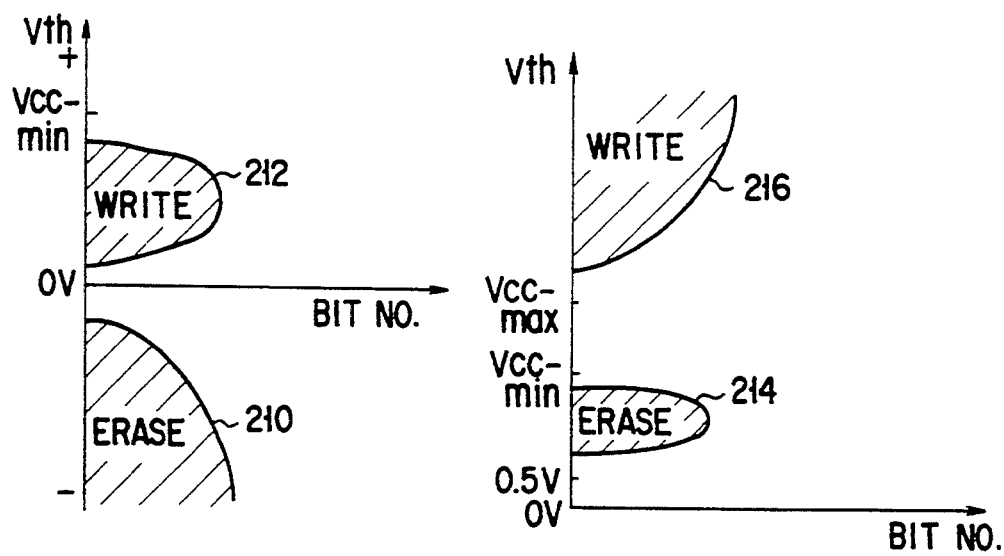
F I G. 18    F I G. 19

ELECTRICALLY ERASABLE AND PROGRAMMABLE NON-VOLATILE MEMORY SYSTEM WITH WRITE-VERIFY CONTROLLER USING TWO REFERENCE LEVELS

This is a continuation of application Ser. No. 07/851,286, filed on Mar. 12, 1992, now U.S. Pat. No. 5,321,699.

BACKGROUND OF THE INVENTION

1. Field of the Invention

The present invention relates generally to semiconductor memory devices, and more particularly to an electrically erasable and programmable nonvolatile semiconductor system including an array of memory cell transistors.

2. Description of the Related Art

With the increasing need for high performance and high reliability of digital computer systems, it is becoming more necessary to develop a large-capacity non-volatile semiconductor memory that can be an alternative to the existing external data-storage medium, such as a magnetic diskette, a fixed disk unit (which is also called the "hard disk unit"), or the like.

Recently, to fulfill the demand, a specific electrically erasable programmable non-volatile read-only memory (EEPROM) has been developed, wherein the integration density of memory cells is greatly enhanced by reducing the number of transistors required to form the cell array on a chip substrate of limited size. The EEPROM of this type is generally called a "NAND-cell type EEPROM" or "NAND type EEPROM," wherein a plurality of series circuits of floating gate tunneling metal oxide semiconductor (FATMOS) field effect transistors each serving as a 1-bit storage cell are arranged so that each of these circuits is connected to a corresponding bit line via a switching transistor. The switching transistor is rendered conductive, when designated, thereby to selectively connect a series circuit of memory cell transistors to a corresponding bit line associated therewith, and is called a "select transistor." The series cell-transistor circuits with the select transistors are called the "NAND cell units" in most cases.

Each NAND cell unit may include four, eight, or sixteen memory cell transistors, each of which has a control gate connected to a corresponding word line and a floating gate that may be charged with charge carriers selectively. Since each "memory cell" includes only one transistor, the integration density of the EEPROM can be improved to increase the total storage capacity thereof.

With presently available NAND type EEPROMs, the remaining non-selected memory cell transistors in each NAND cell unit serve as the "transfer gates" for transferring a data-bit to a target cell being presently selected during a write operation. Looking at a certain NAND cell unit, a select transistor turns on, causing this cell unit to be coupled to a corresponding bit line associated therewith. When a given cell transistor is selected, those non-selected memory cell transistors located between the select transistor and the selected cell transistor are rendered conductive (turn on). If a 1-bit data to be written (write-data) is of a specific logical level ("1" or "0," typically "1"), a data voltage supplied from the bit line is transferred to the selected cell transistor through the non-selected cell transistors. Charge carriers are injected from the drain to the floating gate of the selected cell transistor, charging the floating gate. The resultant threshold voltage of the selected cell transistor changes, causing the write-data to be programmed into the selected cell transistor.

To improve the operating reliability, the non-selected cell transistors serving as "data-transfer gates" during a write (program) or read operation are compelled to meet the following specific requirement: they are limited in variation of threshold voltages thereof. The threshold voltages of these cell transistors should not vary to fall out of a predetermined range (allowable variation range). Otherwise, the write-data to be programmed in the selected cell transistor itself will be varied in potential among the NAND cell units, with the result of the programming reliability being decreased.

With a presently available programming technique for NAND type EEPROMs, it is not easy to meet the above requirement. This may be because the number of memory cell transistors on a chip substrate tend to differ from one another due to inherent deviation either in the manufacturing process or in the physical conditions or therefore less than optimal. Such threshold-voltage variation undesirably permits the coexistence of an easy-to-write cell and a difficult-to-write cell on the same chip substrate, which makes it difficult for an access operation to maintain consistency and uniformity throughout the cell transistors. The resultant operating reliability can no longer be excellent as required.

A similar problem exists during an erase operation. The resulting threshold voltage of a once-erased cell transistor—i.e., a cell transistor into which a logic "0" has been written—should be potentially greater than a predetermined negative level. Otherwise, a sufficient erase performance cannot be achieved; in the worst case, this may lead to the generation of an erase error. The threshold voltage of the erased cell transistor will affect the actual amount of a current (readout current) that may flow therein during a read period, which amount has a direct relation to the data-accessing speed of EEPROMs. In this respect, the threshold-value control is very important. If an insufficiently erased memory cell remains after the erase operation, its resulting threshold voltage will increase beyond the upper-limit of the allowable variation range when a logic "1" is written thereinto during a subsequent program period. Such surplus of the threshold voltage causes the excess-write generation ratio to rise undesirably. As the integration density of the NAND type EEPROMs increases, the threshold-voltage control architecture for memory cells during write/erase operations becomes critical.

SUMMARY OF THE INVENTION

It is therefore an object of the present invention to provide a new and improved non-volatile semiconductor memory system.

It is another object of the invention to provide an electrically erasable and programmable non-volatile semiconductor memory system that can successfully perform a required program operation with higher reliability.

In accordance with the above objects, the present invention is addressed to a specific non-volatile semiconductor memory system, which comprises an array of rows and columns of memory cells comprising electrically erasable and programmable memory cell transistors, and a charge/discharge control unit connected to the array, for causing a sub-array of memory cell transistors selected from the array to change a threshold voltage thereof by changing the amount of electrical carriers being charged therein. The system further comprises a verify unit for verifying a resultant electrical state of the selected memory cell transistors by checking their threshold voltages for variations using a first reference voltage and a second reference voltage potentially greater than the first voltage, and for, when a cell transistor exists having an insufficient threshold voltage which is potentially out of a specific range defined by the first and second voltages, performing an additional charge-amount change operation for a predetermined period to cause the electrical state thereof to be made closer to a sufficient state.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a block diagram showing the internal circuit configuration of a NAND type electrically erasable programable read-only memory in accordance with one preferred embodiment of the invention.

FIG. 2 is a diagram showing the circuit configuration of a memory cell array section of the EEPROM of FIG. 1.

FIG. 3 is a diagram showing a plan view of one the NAND cell units of FIG. 1.

FIG. 6 is a diagram showing the circuit configuration of a sense amplifier, data latch circuit, a comparator, a data input/output buffer shown in FIG. 1.

FIG. 8 is a diagram sowing the internal arrangement of a verify-voltage generation circuit associated with verify-voltage supply circuits shown in FIG. 7.

FIGS. 12 to 16 are flowcharts for five major write-verify operations to be performed on to the EEPROM.

FIG. 17 is a diagram showing the matrix arrangement of an array of memory cells of a NOR-cell type EEPROM, to which the present invention may also be applied.

FIG. 18 is a graph showing the threshold-voltage characteristics of the NAND type EEPROM having the memory cell array shown in FIGS. 1 to 5.

FIG. 19 is a graph showing the threshold-voltage characteristics of the NOR type EEPROM having the memory cell array shown in FIG. 17.

DETAILED DESCRIPTION OF THE PREFERRED EMBODIMENTS

Figure 4:
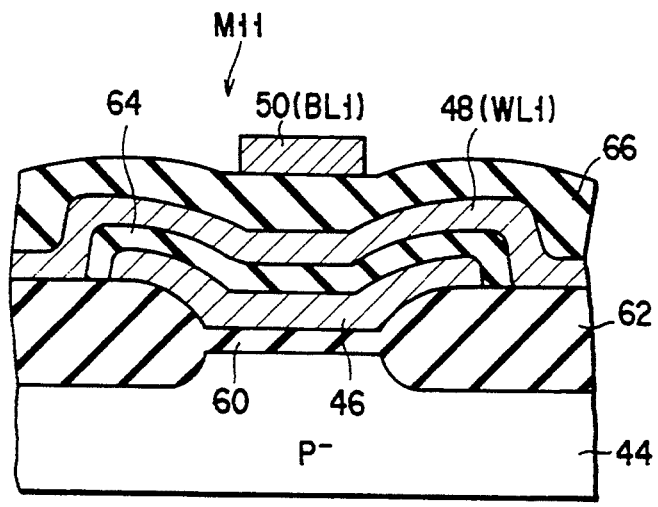
FIG. 4 is a diagram showing the enlarged cross-sectional view of one the memory cell transistors of the NAND cell unit taken along the line IV—IV of FIG. 3.

Referring now to FIG. 1, a NAND-cell type EEPROM in accordance with one preferred embodiment of the invention is designated generally by reference numeral "10." The NAND type EEPROM 10 includes a memory cell array section 12, which includes an array of memory cells arranged in rows and columns to provide a matrix configuration. The cell array section 12 is associated with a row decoder circuit and a column decoder circuit, which are well known and not shown in FIG. 1.

Two controller circuits 14 and 16 are connected to the cell array section 12. The first controller 14 is connected to a plurality of parallel address-control lines (word lines) of cell array section 12, for providing the word lines with control voltage signals in an erase, a write (program), and a read mode. This circuit is called the "word line controller." The second controller 16 is connected to a plurality of parallel data transfer lines (bit lines) of cell array section 12, for providing the bit lines with control voltage signals in the erase, the program, and the read mode. This circuit is called the "bit line controller."

The word line controller 14 is connected to a high voltage generator 18, which provides controller 14 with a specific voltage of predetermined potential level as the high voltage Vpp. This high voltage Vpp is a boosted voltage that is potentially greater than the power supply voltage Vcc of EEPROM 10. Typically, voltage Vpp may be 20 volts when the power-supply voltage is 5 volts. Word line controller 14 and bit line controller 16 are connected to a midlevel voltage generator 20, which generates an intermediate-level or midlevel voltage Vm. Midlevel voltage Vm is potentially less than high voltage Vpp and greater than the ground potential (a substrate potential Vs). Midlevel voltage Vm may be 10 volts.

The word line controller 14 and the bit line controller 16 are connected to an internal address generation circuit 22, which provides them with an internal address signal designating a given cell address in the memory space of array section 12. Controllers 14, 16 are responsive to address generator 22 to cooperate in every operation mode of EEPROM 10. Address generator 22 operates in response to the output signal of a verify-voltage generation circuit 24, which is controlled by a verify-timing controller circuit 26. The functions of these circuits will be described later.

As shown in FIG. 1, the cell array section 12 is also associated with a sense amplifier circuit 28 by way of the bit lines. Sense amplifier 28 senses and amplifies a data voltage that is read from one of the bit lines being presently selected during a read period of EEPROM 10. Sense amplifier 28 is responsive to the bit line controller 16. The output of sense amplifier 28 is connected to a known input/output (I/O) buffer 30.

The output of the sense amplifier 28 is connected to a comparator circuit 32 at its first input. Comparator 32 has a second input, to which a data input buffer circuit 34 is connected via a data latch circuit 36. Buffer 34 fetches data voltages. These data voltages may include a write-data voltage being given to a selected one of the bit lines of cell array 12, and a data-erase voltage that is applied to the word lines and a P-type substrate (to be shown in FIG. 3). Latch circuit 36 temporarily latches the output voltage of buffer 34. More specifically, latch circuit 36 latches a voltage indicative of a data to be written again (rewritten) in accordance with a column address provided by internal address generator 22 during a write verify period, which will be described later.

The comparator 32 compares a data value latched in the latch circuit 36 with a read data supplied from the sense amplifier circuit 28 during a verify period, to detect whether or not these are potentially coincident with each other. Comparison of such potential coincidence will be repeated with respect to each column address. Each comparison result may be temporarily stored and held within comparator 32. The output of comparator 32 is connected to another buffer 38. This buffer may be called the "data input/output buffer." Data buffer 38 is also associated with the above-mentioned I/O buffer 30. The output of I/O buffer 30 is supplied to latch circuit 36.

As shown in FIG. 1, the comparison output of comparator 32 is connected via data buffer 38 to a verify-termination detecting circuit 40. This detector 40 determines a specific time point for termination of the verify operation, in response to the comparison result signal of comparator 32, and generates a termination signal. This signal is supplied to a cell-block managing circuit 42. When the write-verify operation is succeeded in a selected cell block of cell array 12, cell-block manager 42 selects another cell block from cell array 12 as a target block to be subsequently programmed, and generates a block select signal, which is then supplied to verify-timing controller 26. Alternatively, when the selected cell block fails upon its write-verify operation, cell-block manager 42 forces the cell block to be eliminated in access from the cell blocks use as a "unusable block," thereby managing to "protect" this block. The operation of a verify circuit section including circuit units 26, 28, 32, 38, 40, 42 will be explained in detail later.

The internal arrangement of the cell array section 12 is as follows. As shown in FIG. 2, the NAND type EEPROM 10 has parallel bit lines BL and parallel word lines WL in memory section 12. Word lines WL insulatively intersect bit lines BL that are insulatively arranged on a chip substrate 44 (see FIG. 3). Control voltage signals Vcg1, Vcg2, ... Vcg8 are applied by the controller 14 of FIG. 1 to word lines WL respectively. Bit lines BL are connected to controller 16 of FIG. 1.

Each bit line BLi (i=1, 2, ..., n) is connected to a series circuit MU of a predetermined number of floating gate tunneling metal oxide semiconductor (FATMOS) field effect transistors. In this embodiment, each series circuit MUi includes eight FATMOS transistors Mi1, Mi2, ..., Mi8 (i=1, 2, ..., n). For example, a series circuit MU1 includes FATMOS M11, M12, ..., M18. Each transistor Mij (i=1, 2, ..., n; j=1, 2, ..., 8) functions as a 1-bit data storage element or "cell." The series circuit of eight cells is hereinafter referred to as a "NAND cell unit," and transistors M are as "memory cell transistors," or simply "memory cells" in some cases. The arrangement of the upper half of the memory cell matrix shown in FIG. 2 is similar to the one described above. The NAND cell units MU of FIG. 2 constitutes one "cell block" on substrate 44.

It is apparent from viewing FIG. 2 that the memory cell transistors Mi1, Mi2, ..., Mi8 are electrically connected at their control gate electrodes to word lines WL1, WL2, ..., WL8, respectively, in each NAND cell unit MUi. Each NAND cell unit MUi is connected to a corresponding bit line BLi through a first switching transistor Qi1, which may be a metal oxide semiconductor field effect transistor (MOSFET). For example, NAND cell unit MU1 is connected to bit line BL1 through MOSFET Q11. The MOSFETs Q1 (=Q11, Q21, ..., Qn1) are commonly connected at the insulated gate electrodes thereof to a select-gate line SG1. Each MOSFET Qi1 is selectively rendered conductive in response to a voltage signal Vsg1 supplied to select-gate line SG1, causing a NAND cell unit MUi associated therewith to be electrically connected to a corresponding bit line BLi. The switching MOSFET Qi1 is referred to as a "first select transistor."

As shown in FIG. 2, the NAND cell units MU1, MU2, ..., MUn are connected together to a common source line CS (common source voltage Vs) via second switching transistors (MOSFETs) Q2 (=Q12, Q22, ..., Qn2), respectively. The source voltage Vs is potentially equivalent to the ground potential, which is 0 volts in this embodiment. Looking at NAND cell unit MUi for explanation purposes only, second MOSFET Q12 is connected between the source electrode of a final-stage memory cell transistor M18 included in NAND cell unit MU1 and the common source voltage Vs. The second MOSFETs Q2 are commonly connected at their gates to a second select-gate line SG2. Each MOSFET Qi2 effects a switching operation in response to a voltage signal Vsg2 supplied to second select-gate line SG2; when it turns on, a corresponding NAND cell unit MUi associated therewith is then coupled to common source voltage Vs. The switching MOSFET Qi2 is referred to as a "second select transistor" hereinafter.

The plan view of the eight memory cell transistors M11 to M18 of NAND cell unit MU1 is illustrated in FIG. 3, wherein intermediate dielectric layers on or above a lightly-doped P type (P- type) substrate 44 are omitted for illustration purposes. Each memory cell transistor M1j (j=1, 2, ..., or 8) has a floating gate 46 that insulatively overlies P- type substrate 44. The floating gate acts as a charge storage layer. Each memory cell transistor Mij also has a control gate electrode 48 insulatively disposed over the floating gate 46. Control gate electrodes 48 extend linearly to function as the word lines WL. Note in FIG. 3 that the underlying floating gate 46 is illustrated to be slightly wider than control gate electrode 48, for illustration purposes only, and that the width thereof is substantially same as that of the overlying control gate electrode 48 in a practical device. The first and second select transistors Q11, Q12 are arranged on both end portions of the series circuit of memory cell transistors M11 to M18. The select transistors Q11, Q12 each have the insulated gate electrodes 46, 48, which will be referred to as "select gate electrodes."

The bit line BL1 is formed of an elongate metal layer 50, which may be an aluminum layer. This layer extends to insulatively intersect control gate electrodes 48, first select-gate electrode 52, and second select-gate electrode 54. In FIG. 3, layer 50 is illustrated to be partly cut away, for convenience of illustration, to reveal an underlying heavily-doped N (N+) type semiconductor diffusion layer 56 that is formed in the surface of substrate 44. Layer 56 is kept at the common source voltage Vs. First select transistor Q11 is electrically connected at its drain layer 50 (bit line BL1) via a contact hole 58, which is formed in layer 50. The second select transistor Q12 is connected at the source thereof to common source voltage vs.

The sectional structure of one of the memory cell transistors M (memory cell M11, for example) included in the NAND cell unit MU1 is shown in detail in FIG. 4. A thin dielectric film 60 is deposited on the top surface of substrate 44. Dielectric film 60 is positioned in an element formation area defined by an element-separation dielectric layer 62. Dielectric layers 60, 62 may be oxide films that are formed by a known chemical vapor deposition (CVD) technique. Dielectric film 60 serves as a gate insulation film of transistor M11. The floating gate 46 is stacked on gate insulation film 60. The length thereof is determined so that it partly covers element-separation layer 62 at its opposite end portions as shown in FIG. 4. Floating gate 46 is covered with another dielectric film 64. Control gate electrode 48 is formed on dielectric film 64. Floating gate 46 defines a preselected capacitance between it and substrate 44; floating gate 46 also defines another capacitance between it and control gate electrode 48. Control gate 48 (word line WL1) is covered with a dielectric layer 66, on which metal wiring layer 50 (bit line BL1) is formed.

Figure 5:
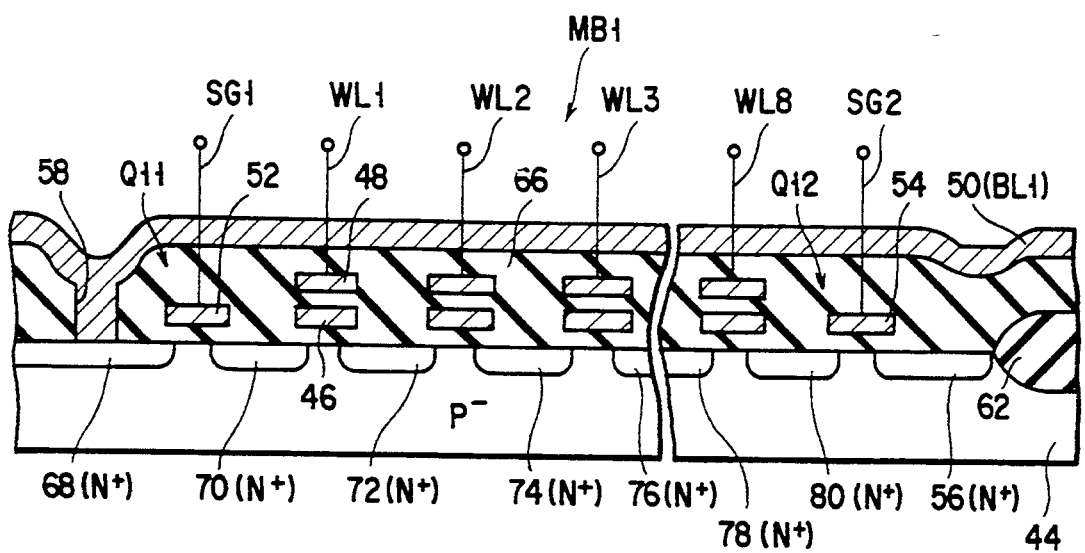
FIG. 5 is a diagram showing another enlarged cross-sectional view of the memory cell transistor along the line V—V of FIG. 3.

The longitudinal cross-sectional structure of the NAND cell unit MU1 is illustrated in FIG. 5. A plurality of N+ type semiconductor diffusion layers 68, 70, 72, 74, 76, ..., 78, 80, 56 are arranged in the substrate surface with a predetermined distance therebetween along the lengthwise direction of bit line BL1. N+ type layer 68 serves as the drain of first select transistor Q11. As is apparent from viewing FIG. 5, this layer 68 is connected to metal bit-line layer 50 by way of contact hole 58. N+ type layer 70 serves as the source of first select transistor Q11. This N+ type layer 70 also serves as the drain of adjacent memory cell transistor M11. Similarly, N+ type layer 72 acts as the source and drain of adjacent memory cell transistors M11, M12. The N+ type layer 56 functions as the source of second select transistor Q12; layer 56 is also connected to common source voltage Vs.

The sense amplifier circuit 28, comparator 32, data latch 36, and data input/output buffer 38 shown in FIG. 1 may be arranged as shown in FIG. 6, wherein sense amplifier 28 and latch 36 are associated with a plurality of bit lines BL. Sense amplifier 28 senses and amplifies a certain voltage that appears on a bit line BLi corresponding to a specific address ai, which is selected by a logical processing between a sense-control signal SENSE and one of address bits a0, a1, ..., an. Latch circuit 36 temporarily stores, in a corresponding to latch section LAi, a data voltage that corresponds to the address specified by a logical processing between a latch control signal LATCH and the selected address ai.

The output of the sense amplifier 28 and the output of latch 36 are connected by wiring lines 82, 84 to the comparator 32. Comparator 32 includes an inverter 86 having an input connected to line 82, a two-input NAND gate 88 having inputs connected to line 84 and the output of inverter 86 and line 84, another inverter 90 having an input connected to the output of NAND gate 88, and a latch unit 92 essentially consisting of two transistors and two inverters connected together as shown in FIG. 6. Comparator 32 compares a data voltage being latch by latch 36 with the output voltage of sense amplifier 28, to generate a 1-bit comparison result signal. The comparison result is held in latch unit 92 in response to latch signals LATCHV, $\overline{\text{LATCTV}}$ (to be typed as "LATCHV(bar)" hereinafter). Data input-/output buffer 38 includes two inverters 94, 96, and a latch circuit 98 formed of two transistors. Latch unit 98 is connected at its one terminal to a wiring line 100, which is coupled to data latch 36. A circuit node 101 between inverter 96 and latch unit 98 is connected to the verify-termination detector 40 shown in FIG. 1.

Figure 7:
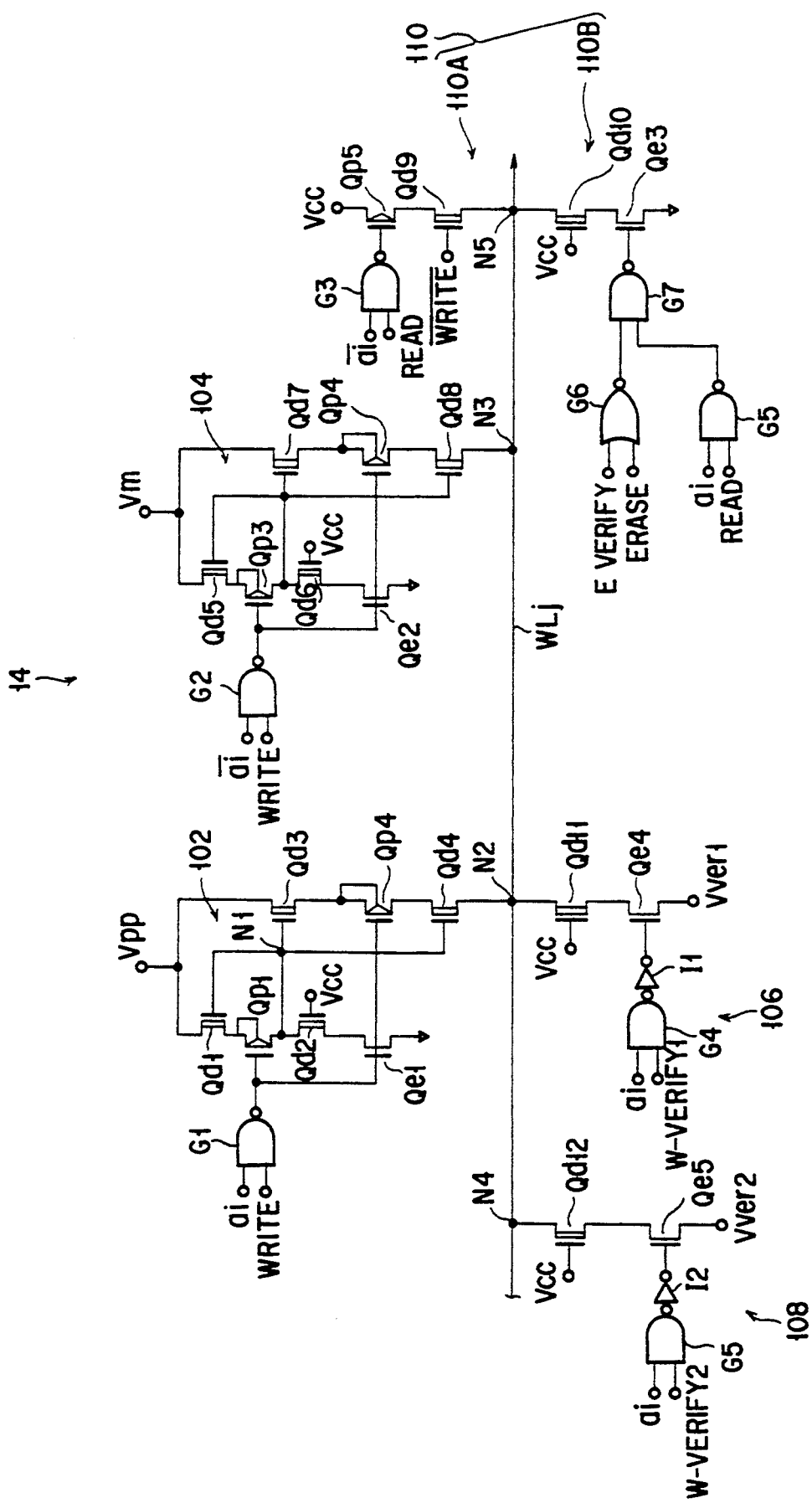
FIG. 7 is a diagram showing the internal circuit configuration of a word-line controller of FIG. 1.

The internal circuit configuration of the word-line controller 14 of FIG. 1 is illustrated in FIGS. 7 and 8, wherein only one controller circuit component associated with a word line WLj is shown as those associated with the remaining word lines are similar to the circuit of FIGS. 7 and 8. As shown in FIG. 7, controller 14 includes five voltage-generating circuits connected to word line WLj: a high-voltage supply circuit 102, a midlevel voltage supply circuit 104, a first verify-voltage supply circuit 106, a second verify-voltage supply circuit 108, and a an erase/read control circuit 110.

The high-voltage supply circuit 102 receives a boosted voltage Vpp provided by the high-voltage voltage generator 18 of FIG. 1, and supplies word line WLj with voltage Vpp when required. The midlevel voltage supply circuit 104 receives intermediate-level or midlevel voltage Vm supplied by voltage voltage generator 20 of FIG. 1, and applies this voltage to word line WLj when word line WLj associated with circuit 104 is kept non-selected during a program mode of EEPROM 10. First verify-voltage supply circuit 106 selectively supplies word line WLj with a first verify voltage Vver1 in response to a write-verify control signal W-VERIFY1. Second verify-voltage supply circuit 108 selectively supplies word line WLj with a second verify voltage Vver2 in response to a write-verify control signal W-VERIFY2. The functional "allocation" between first and second verify circuits 106, 108 is as follows: First circuit 106 is to verify a cell transistor being selected for programming and being presently subjected to a data-write operation to determine whether or not its resultant written state is potentially insufficient (insufficient write); second circuit 108 is to verify the same cell transistor to determine whether or not the resulting written state thereof is potentially in an excess state (excess-write). Erase/read control circuit 110 is responsive to a read control signal READ, an erase control signal ERASE, and an erase-verify control signal E-VERIFY, and causes word line WLj to be set at a suitable potential as required.

As shown in FIG. 7, the high-voltage supply circuit 102 includes a series circuit of depression-type (D type) N-channel MOS field effect transistors (FETs) Qd1, Qd2, a P-channel MOSFET Qp1, and an enhancement-type (E-type) N-channel MOSFET Qe1. FETs Qp1, Qe1 have the insulated gates connected to the output of a NOR gate G1, which has a first input for an address bit ai, and a second input for a write control signal WRITE. High-voltage circuit 102 further includes a series circuit of a D-type N-channel MOSFETs Qd3, Qd4, and a P-channel buffering MOSFET Qp2. The gate electrodes of FETs Qd1, Qd3, Qd4 are connected together at a circuit node N1. The insulated gate electrode of FET Qp2 is connected to the output of NAND gate G1. High-level circuit 102 is connected to word line WLj at a circuit node N2. Note that FETs Qd1–Qd4 may serve as potential protectors for FETs Qp1, Qp2; in particular, FET Qd4 acts to prevent the drain junction section of FET Qp2 from being set in a forward-biased condition when a positive voltage is externally supplied to word line WLj.

The midlevel voltage supply circuit 104 is similar in arrangement to circuit 102 with the NAND gate G1 being replaced with a NAND gate G2 and with the FETs Qd1–Qd4, Qp1–Qp2, Qe1 being replaced by FETs Qd5–Qd8, Qp3–Qp4, Qe2, respectively. NAND gate G2 receives an address bit $\overline{ai}$ (to be typed as "ai(bar)" hereinafter). Circuit 104 is connected at a node N3 to word line WLj.

As shown in FIG. 7, the first verify-voltage supply circuit 106 includes a series circuit of a D-type N-channel MOSFET Qd11 and an E-type P-channel MOSFET Qe4. FET Qd11 has its gate electrode, to which the power supply voltage Vcc is supplied. FET Qe4 has source and drain electrodes one of which receives the first verify-voltage Vver1, and the gate electrode, to which the output of a NAND gate G4 is connected through an inverter I1. NAND gate G4 has a first input for receiving an address bit ai, and a second input for receiving the write-verify control signal W-VERIFY1. Circuit 106 is coupled at node N2 with word line WLj.

The second verify-voltage supply circuit 108 is similar to circuit 106 with the components G4, I1, Qd11, Qe4 being replaced with corresponding ones G5, I2, Qd12, Qe5, and with signals ai, W-VERIFY1 being replaced by ai, W-VERIFY2, respectively, as shown in FIG. 7. Circuit 108 is coupled at a circuit node N4 to word line WLj.

The erase/read control circuit 110 includes two major units 110A, 110B. Circuit unit 110A includes a series circuit of a P-channel MOSFET Qp5 and a D-type MOSFET Qd9, which circuit is connected at a circuit node N5 to word line WLj. FET Qp5 has source and drain regions one of which is coupled to the power supply voltage Vcc, and a gate region to which a NAND gate G3 is directly connected. NAND gate G3 has a first input for receiving address ai(bar), and a second input for the read control signal READ. The second unit 110b includes a series circuit of a D-type MOSFET Qd10 and a E-type MOSFET Qe3. The gate of FET Qd10 is connected to voltage Vcc. The gate of FET Qe3 is associated with three logic gates: a NOR gate G5 and NAND gates G6, G7, as shown in FIG. 7.

A voltage generation circuitry for providing the circuits 106, 108 with the aforementioned two verify voltages Vver1, Vver2 may be arranged as shown in FIG. 8, wherein the circuitry is generally designated by numeral "120." The voltage generator 120 includes a pair of cross-coupled P-channel MOSFETs Qp6, Qp7, each of which has a gate connected to the drain of the other FET associated therewith. The source electrodes of FETs Qp6, Qp7 are connected to the power-supply voltage Vcc inputs. The drain electrodes of FETs Qp6, Qp7 are connected to the ground potential by way of E-type N-channel MOSFETs Qe8, Qe9 respectively. The gate of FET Qe8 is connected to that of FET Qe9 via an inverter I3. The input of inverter I3 is connected to voltage input terminals 122, 124, to which the write-verify control signals W-VERIFY1, W-VERIFY2 are supplied respectively.

The FETs Qp7, Qe9 are connected together at a circuit node N6, which is coupled with a voltage-divider circuit 126 that includes a series circuit of four resistors R1 to R4, and a series circuit of E-type N-channel MOSFETs Qe6, Qe7 and an intrinsic-type (I-type) N-channel MOSFET QI, which FETs are connected at their gates to resistors R as shown in FIG. 8. The series circuit of FETs Qe6, Qe7, QI has a first terminal connected to the power supply voltage Vcc, and a second terminal connected to the ground potential. A connection node between FETs Qe7, QI provides a node N7 serving as an output for generating the first verify-voltage Vver1. A connection node between FETs Qe6, Qe7 provides an output node N8 for generating the second verify-voltage Vver2. The FETs Qp6, Qp7, Qe8, Qe9 and inverter I3 constitutes a switch circuit for the voltage-divider 126; when one of control signals W-VERIFY1, W-VERIFY2 is supplied to the gate of FET Qe8 and the input of inverter I3, voltage-divider 126 generates a corresponding voltage Vver1 or Vver2, which is potentially intermediate between the power supply voltage Vcc and the ground potential, and which is supplied to a corresponding one of the circuits 106, 108 shown in FIG. 7. The switch circuit is important in that it may prevent an undesirable through-current from flowing in voltage-divider 126.

When the write-verify control signal W-VERIFY1 goes high, FETs Qe8, Qp7 turn on, and FET Qe9 turns off, permitting the power supply voltage Vcc to appear at node N6. Voltage Vcc is then supplied to resistor R1 of voltage-divider 126. FETs Qe6, Qe7, Qi are set in a specific conduction state so that the first voltage Vver1 may be produced to have a specific potential determined by the voltage-dividing ratio of divider 126. When signal W-VERIFY2 goes high, a similar operation will be performed. On the other hand, each of signals W-VERIFY1, W-VERIFY2 is kept low, FET Qe9 turns on, causing node N6 to be at the ground potential. Nodes N7, N8 are thus rendered electrically "floating." At this time, FET Qp7 turns off so that no currents flow.

Figure 9:
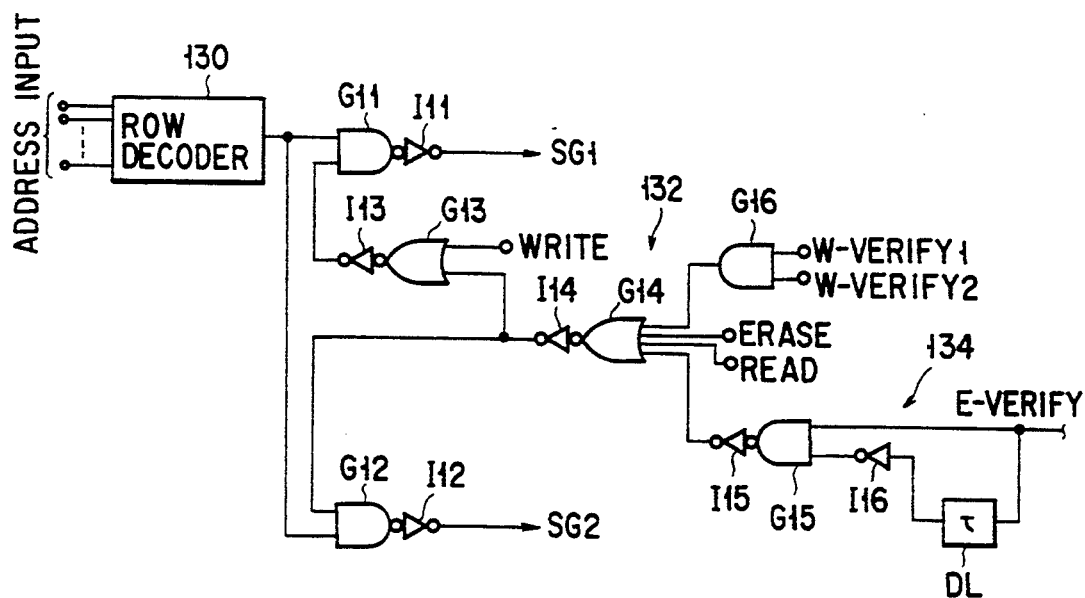
FIG. 9 is a diagram showing a circuitry for driving first and second select-gate lines of FIG. 2.

An exemplary control circuitry for the two select-gate lines SG1, SG2 of FIG. 2 is shown in FIG. 9, wherein the output of a row decoder 130 is connected through a two-input NAND gate G11 and an inverter I11 to the first select-gate line SG1. The decoder output is also connected to the second select-gate line SG2 through a two-input NAND gate G12 and an inverter I12. A driver circuit 132 is connected to NAND gates G11. G12. Driver 132 includes a two-input NOR gate G13. NOR gate G13 has a first input to which the write control signal WRITE is supplied, and a second input coupled to NAND gate G12. The output of NAND gate G13 is coupled through an inverter I13 to NAND gate G11. Driver 132 also includes a NOR gate G14, which is connected through an inverter I14 to the second input of NOR gate G13. NOR gate G14 has four inputs: an input connected to a timer circuit 134, an input for receiving read control signal READ, an input for receiving erase control signal ERASE, and an input connected to an AND gate G16 having two inputs, to which first and second verify voltages Vver1, Vver2 are supplied respectively. Timer 134 includes a delay circuit DL, inverters I15, I16, and a NAND gate G15 as shown in FIG. 9. One input of NAND gate G15 and the input of delay circuit DL connected together are supplied with erase-verify control signal E-VERIFY.

When the write signal WRITE goes high, a high-level voltage appears at the output of inverter I13 and is then supplied to NAND gate G11, whereby first select-gate line SG1 is selected. At this time, second select-gate line SG2 is maintained in a non-selected state. When any one of erase signal ERASE, read signal READ, write-verify signals W-VERIFY1, W-VERIFY2, and erase-verify signal E-VERIFY goes high, the high-level voltage is input to NOR gate G13, causing the both of first and second select-gate lines SG1, SG2 to be selected at a time.

Note that, since the erase-verify signal E-VERIFY is also allowed to be supplied to the NAND gate G15 through timer 134, the transmission of signal E-VERIFY toward NOR gate G14 is limited to be made only during a constant delay time period $\tau$, which is determined by delay circuit DL. More specifically, when erase-verify signal E-VERIFY goes high, the high-level voltage is input to NOR gate G14, causing first and second select-gate lines SG1, SG2 to be selected simultaneously. During this selection, one input of NAND gate G15 is prevented from being at high level potential until delay time $\tau$ has elapsed. Only after delay time period $\tau$, the two inputs of NAND gate G15 go high. The first input of NOR gate G14 returns from high to low potential. Note here that delay circuit DL may be arranged in a known analog fashion using the combination of a resistive element and a capacitive element; alternatively, it may be arranged in a known digital fashion using the combination of a ring-oscillator and a counter. In the latter case, the oscillator output is counted by the counter, and when the count value reaches a preset level, the original potential of erase-verify signal E-VERIFY is fed to inverter I16.

Figure 10:
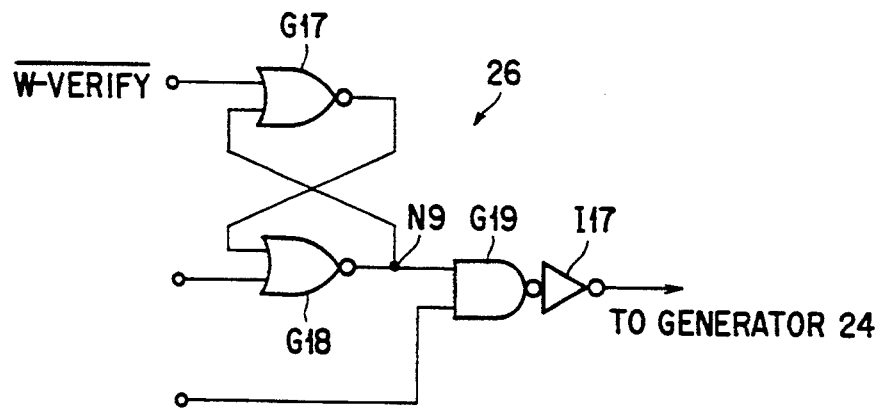
FIG. 10 is a diagram showing the internal arrangement of a verify-timing controller of FIG. 1.

The internal circuit arrangement of the verify-timing controller 26 of FIG. 1 is shown in FIG. 10, wherein controller 26 includes a flip-flop circuit consisting of a pair of cross-coupled two-input NOR gates G17, G18, which have a common output node N9. Controller 26 further includes a two-input NAND gate G19 and an inverter I17. NAND gate G19 has an input connected to node N9.

The operation of the NAND type EEPROM 10 is as follows. The cell block manager 42 of FIG. 1 selects a cell block from among the cell blocks, each of which includes the NAND cell units MU shown in FIG. 2. Prior to a program operation being performed with respect to the selected cell block, all the memory cell transistors M included in this block are first subjected to a simultaneous erase operation. As has been already mentioned, the "erase" is defined as writing a logic "0" into the memory cell transistors.

During the simultaneous erase period, a zero-volt voltage is applied by word-line controller 14 of FIG. 1 to all control-gate lines (word lines) WL of FIG. 2. The erase signal ERASE is supplied to erase/read control unit 110 of controller 14 shown in FIG. 7. FET Qe3 turns on, causing the potential on all bit lines WL to be at 0 volts. At this time, the high voltage Vpp is applied to first and second select-gate lines SG1, SG2, bit lines BL, and P− type substrate 44 (alternatively, a P− type well region arranged in the substrate, if this substrate is of N type conductivity). Voltage Vpp is also applied to non-selected cell blocks of EEPROM 10. By forcing such a biasing condition to maintain for a predetermined time period (typically ten milli-seconds), electrons released from the floating gates of all cell transistors M in the selected block, causing the threshold voltages of these cell transistors to change or shift in potential toward the negative polarity. As a result, these cell transistors are set in the "0"-written state.

Subsequently, an erase-verify operation is performed, which is for verifying the resultant threshold voltages of the once-erased cell transistors to determine whether or not the threshold voltages are as "deeply" negative in polarity as required. A detailed explanation of the erase-verify operation is as follows. With reference to the internal circuit configuration of controller 14 shown in FIG. 7, FET Qe3 turns on when erase-verify signal E-ERASE is supplied to erase/read control unit 110. All word lines WL are at 0 volts in the selected cell block, regardless of any address input being presently supplied. At the same time, erase-verify signal E-VERIFY arrives at the circuit of FIG. 9. In responding to this, first and second select-gate lines SG1, SG2 are set at a 5-volt potential, which has been so selected as to be high enough to cause select transistors Q11, Q12, . . ., Qn21 of FIG. 2 to turn on. Bit lines BL are applied with a 1.5-volt potential, for example. The turn-on of select transistors Q12, Q22, . . . , Qn2 permits the source electrodes of NAND cell units MU1, MU2, . . . , MUn to be connected to common source line CS of FIG. 2. The source electrodes are at ground potential Vs. The length of time period for forcing first and second select-gate lines SG1, SG2 to be held at the 5-volt potential is suitably selected to be long sufficient to cause a logic "0" data to appear on a corresponding bit line BLi under a desirable condition that the actual threshold voltages of the erased cell transistors exhibit the significantly deep negative level. The management of such time length is carried out by the timer circuit 134 including delay circuit D1 shown in FIG. 9. Typically, such time length may be 150 nanoseconds. Note that this value is selected under an assumption that the deep negative level after erase is potentially less than the threshold voltage in a case wherein a necessary readout time is 200 nanoseconds when a 10-microampere current flows in the memory cell transistors by using a 1.5-volt potential as the bit-line voltage. After the erase-verify period, if logic "0" cannot be read from any one of bit lines BL, a similar simultaneous-erase operation will be repeated. Such repeat of erase (re-erase) operation will be carried out until the erase-verify is succeeded.

Thereafter, the EEPROM 10 is set in a selective program operation mode, wherein a certain NAND cell unit MUi (i=0, 1, . . ., or n) is selected from the plurality of NAND cell units MU in the selected cell block and then subjected to a write (program) operation in such a manner that a 1-bit data, i.e., a logic "1" or "0" to be transmitted by a corresponding bit line BLi, is sequentially written into the cell transistors Mi1–Mi8 in the selected NAND cell unit. The sequential writing of the cell transistors Mi1–Mi8 is typically made in the reverse order that these cell transistors are numbered in the NAND cell unit. More specifically, assuming that the NAND cell unit MU1 is selected, the last cell transistor M18 is programmed first, and the first cell transistor M11 is programmed last.

The explanation of the program operation continues under the assumption that the NAND cell unit MU1 is selected. First of all, eight words of write-data may be supplied to data latch circuit 36 through data input/output buffer 34 of FIG. 1, and temporarily stored therein. The voltage on bit line BL1 is controlled in accordance with the actually latched data voltages. During the sequential write, high voltage Vpp is applied to a word line WLj connected with the control gate of a selected memory cell transistor M1j (j=1, 2, . . . or 8). The midlevel voltage Vm is applied to the word lines associated with those of the remaining non-selected cell transistors which are positioned between first select transistor Q11 and the selected cell transistor Mij, i.e., word lines WL1, WL2, . . . , WL(j−1) associated with non-selected transistors M11, M12, . . . , Mi(j−1). When cell transistor M18 is selected for writing in FIG. 2, mid-level voltage Vm is applied to word lines WLi to WL7, thereby forcing non-selected cell transistors MI1 to M17 to turn on. If cell transistor M13 is selected, mid-level voltage Vm is applied to word lines WL1 and WL2, causing non-selected cell transistors Mi1, M12 to turn on. The supplement of such voltages to the selected word line and the non-selected word lines may be attained by activating either high-voltage supply circuit 102 or midlevel voltage supply circuit 104 of FIG. 7, which is selected by a logical processing between write signal WRITE and addresses ai, ai(bar).

The bit line BL1 associated with the selected NAND cell unit MU1 is applied with a suitable potential that corresponds to the logic value of a data to be written (write-data). For example, when logic "1" is to be written, a low-level voltage (zero volts) is used; if the write-data is a logic "0," midlevel voltage Vm is given to bit line BL1. The write-biasing state is maintained for a suitable time period. In this embodiment, the period is about 1/100 the period required in the conventional NAND type EEPROMs, i.e., ten microseconds. The bit-line potential (write-data voltage) is transferred to the drain electrode (N+ layer 78 of FIG. 5) of selected memory cell transistor M18 through non-selected cell transistors M11, M12, . . . , M17. When the write-data is logic "1," the electric field is internally created between substrate 44 and the control gate electrode of selected cell transistor M18, causing electrons to tunnel from substrate 44 to the floating gate of cell transistor M18, thereby charging this floating gate (accumulation of carriers). The threshold voltage of cell transistor M18 thus changes or shifts toward the positive polarity. Alternatively, when the write-data is logic "0," the above tunneling phenomenon of electrons does not take place with the result of the threshold voltage of selected cell transistor M18 being held at the negative polarity. A similar program operation will be repeated with respect to each of the remaining cell transistors M17, M16, . . . , M11, which will be sequentially selected in this order.

The EEPROM 10 is then set in a write-verify operation mode, which is to verify the memory cell transistors written with logic "1" to determine whether or not the actual threshold voltages thereof fall within the previously described allowable variation range (reference threshold-voltage range) using the first and second write-verify voltages Vver1, Vver2. First verify voltage Vver1 defines the lower-limit potential level of the reference threshold-voltage range, whereas second verify voltage Vver2 defines the upper-limit potential level of the reference range. Therefore, if the resultant threshold voltage of a cell transistor programmed is potentially greater than the first verify voltage Vver1 and yet less than second verify voltage Vver2, this cell transistor should be judged to be regularly programmed. Obviously, if the resultant threshold voltage of the cell transistor is potentially less than the first verify voltage Vver1, it should be judged that this cell transistor remains insufficient in its writing state (the insufficient-write state); if, on the other hand, the resultant threshold voltage is higher than the second verify voltage Vver2, the cell transistor is determined to be electrically "over-written" or in the "excess-write" state. The above reference threshold-voltage range must be suitably determined by experimentation with careful consideration of the physical data-storage characteristics of NAND type EEPROMs manufactured and the potential level of the power-supply voltage to be employed therein; for example, in a preferred embodiment, the power supply voltage ranges from 1.5 volts to 3.5 volts. While the detailed write-verify process will be given later in this description, it may be recommendable most cases that the lower-limit verify (insufficient-written cell verify) step be performed before the upper-limit verify (excess-written cell verify) step.

Figure 11:
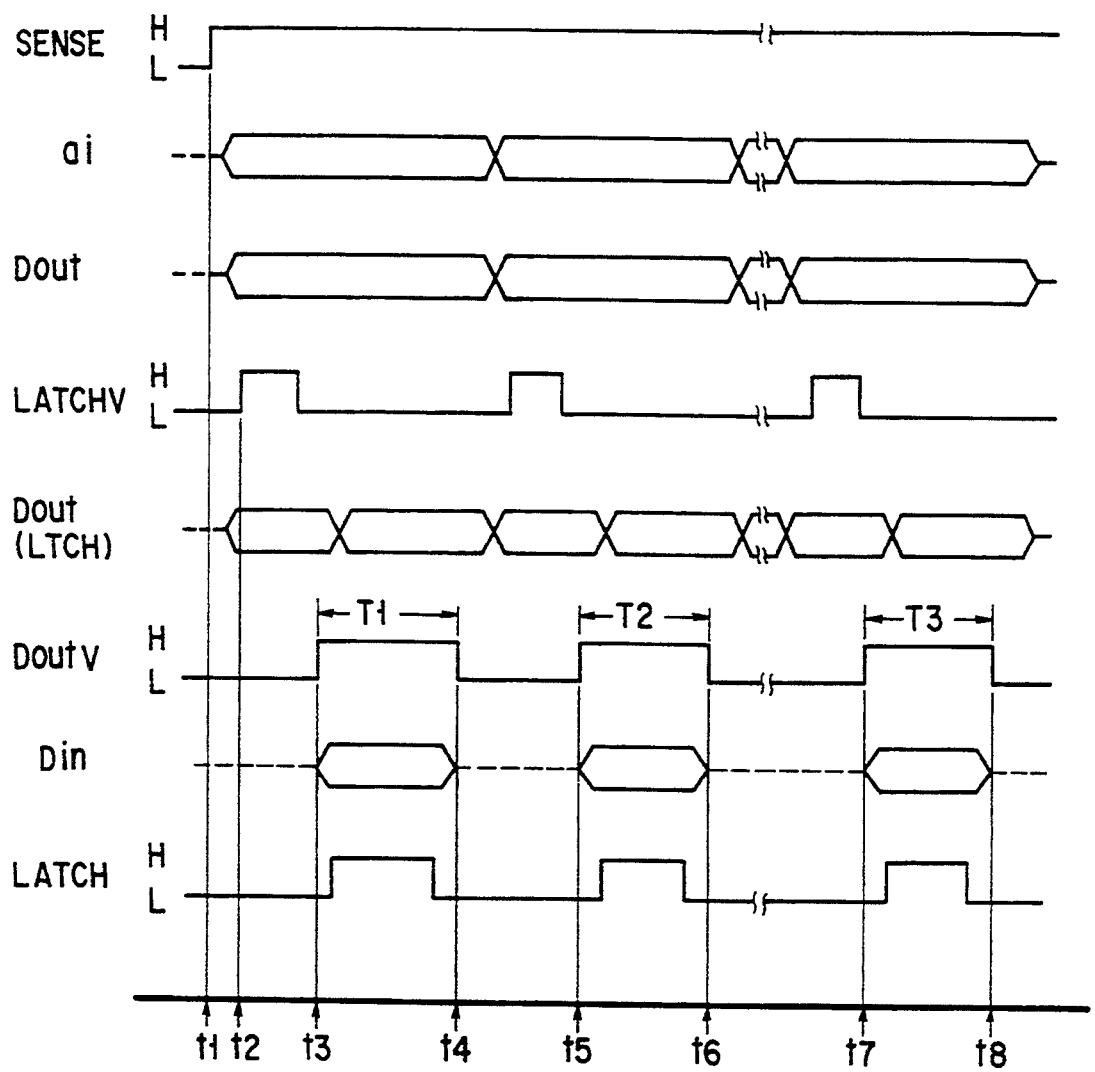
FIG. 11 is a diagram showing the waveforms of the main signals generated at the main portions of the EEPROM shown in FIGS. 1 through 9.

As shown in FIG. 11, at a time point t1, the sense-control signal SENSE supplied to the sense amplifier circuit 28 of FIG. 6 goes high, thus energizing this sense amplifier. This is known as "enabling" of the sense amplifier among those skilled in the semiconductor memory art, when a column address ai is generated by the address generator 22 of FIG. 1, a data value read out onto the data input line 82 of FIG. 6 is generated outward (see "Dout" shown in FIG. 11). Simultaneously, latch data Dour(LATCH in the data latch circuit 36 of FIG. 6 appears on wiring line 84. In this write-verify cycle, each of the first and the second verify voltages Vver1, Vver2 are given by the voltage divider circuit 126 of FIG. 8 to the control circuit unit 106, 108 of FIG. 7 one at a time. By executing a logical processing between these voltages and address ai, ai(bar), first verify voltage Vver1 (1.5 volts) is supplied by unit 106 to the selected word line WLj. The remaining, non-selected word lines WL1, WL2, . . . , WL(j−1), WL(j+i), . . . , WL8 are applied with the power-supply voltage Vcc, causing corresponding non-selected cell transistors to turn on. The application of voltage Vcc occurs due to the output of NAND gate G3 of the erase/read control unit 110 of FIG. 7 going to low-level potential. During the write-verify operation, the first and second select-gate lines SG1, SG2 are at voltage Vcc, causing first and second select transistors Q12 to turn on. When a 1.5-volt voltage is applied to the selected bit line BL1, this voltage is permitted to be transferred to the selected NAND cell unit MU1 via select transistors Q11, and the eighth memory cell transistor M18 are also permitted to be coupled at its source electrode to the common source (ground) voltage Vs.

Under the voltage application condition, if the resultant threshold voltage of memory cell transistor M1j programmed is potentially equal to or greater than 1.5 volts, this cell transistor is rendered nonconductive (turns off). Therefore, no read current will flow in a corresponding bit line. This state corresponds to the data readout of a logic "1." On the other hand, if the cell threshold voltage is less in potential than 1.5 volts, the cell transistor is rendered conductive (turns on). A read current begins to flow in the corresponding bit line, thus reading out a logic "0" data. This read data is then transferred to the comparator 32 of FIG. 6, and compared with the original potential of write-data (original data to be written). The comparison result is stored in the latch unit 92 of FIG. 6, when latch signal LATCHV goes high at a time point t2 of FIG. 11. When the read data obtained by sense amplifier 28 is a logic "1," this data is inverted by inverter 86 in comparator 32, and then supplied to NAND gate 88 together with latch data "1" of data latch circuit 36. The data "1" is inverted by inverter 90, and latched in latch circuit 92. While the original write-data to be programmed in the selected cell transistor is logic "1," if the data actually read therefrom is logic "0," a logic "1" is latched in latch circuit 92. If the original write-data is logic "0," a logic "0" is latched in latch circuit 92 regardless of the actual logic value of the read data. The above data-latch operation executed within comparator 32 is summarized in TABLE 1 as follows.

TABLE 1

|  | Logic Level | | | |
| --- | --- | --- | --- | --- |
| Data in Latch 36 | 1 | 1 | 0 | 0 |
| Output of Sense-Amp. 28 | 1 | 0 | 1 | 0 |
| Output of Comparator 32 | 0 | 1 | 0 | 0 |

As is apparent from TABLE 1, if the write-data is logic "1," that is, if "1" is latched in latch circuit 36, a logic "1" appears at the output of comparator 32 only when "0" is read out by sense amplifier 28. In the other cases, a "0" appears at the output of comparator 32. In other words, the comparator output becomes "1" only when the data actually read from a corresponding cell transistor during the verify operation that follows the write operation of logic "1" is identical with the original write-data. When the read data is "0" in the case of writing logic "1," or when the write-data itself is logic "0," the comparator output becomes a logic regardless of the actual logic value of the read data.

While the output of the comparator 32 (the data actually read by verify process) is logic "1," the verify-termination detector 40 does not generate any verify-termination signal. More specifically, when logic "1" appears at the output of comparator 32 after the flip-flop circuit consisting of NOR gates G17, G18 of FIG. 10 is initialized in response to write-verify signal W-VERIFY1, this flip-flop circuit is set at logic "0." This state will be held until the data comparison is completed. The verify-termination signal is thus held at "0." This shows that the write-verify process remains unfinished. A comparison-completion signal becomes at logic "1" after the completion of the comparing operations for the write-verify with respect to all NAND cell units in the selected cell block. However, unless the write-verify process is completed successfully, the verify output signal DoutV will be held at high potential (see a period T1 defined between time points t3 and t4, a period T2 between t5 and t6, a period T3 between t7 and t8 shown in FIG. 11). Therefore, the output of comparator 32 is fed back to latch 36 by way of data buffer 38 and I/O buffer 30 as shown in FIG. 1, and then latched therein as a new data.

As is apparent from TABLE 1, logic "1" data is latched in comparator 32 only for an address of the cell that is verified to be "insufficient" in its electrical write state. The "1"-latch forces the verify-termination signal to be at logic "0"; thus, the verify process will continue. This means that a rewrite (reprogram) operation is now performed with respect to the cell address. The rewrite operation will be repeated until the output of comparator 32 becomes logic "1." When logic "1" does not appear at the output of comparator 32 associated with each of all the addresses, while the flip-flop circuit is continuously fixed at "0," the comparison completion signal changes to "1" with the result of the verify-termination signal being set at logic "1." This indicates that the actual threshold voltages of all the memory cell transistors programmed are verified to be potentially greater than the lower-limit level of the reference region (allowable variation region). At this time, the first write-verify is terminated.

Subsequently, the second write-verify operation begins for the same NAND cell unit. This operation is to verify the memory cell transistors programmed to determine if their actual threshold voltages remain less than the upper-limit (3.5 volts) of the reference region, using the second write-verify voltage Vver2. The second write-verify operation differs from the first write-verify operation in that, while the 5-volt voltage has been applied to the non-selected memory cell transistor(s) during the first writ-verify operation, a voltage similar to that used in an ordinary read period is applied to the non-selected cell transistor(s).

If the actual threshold voltage of a memory cell transistor, which is selected from among those Mi1 to Mi8 of NAND cell unit MUi, is higher than the second verify voltage Vver2, the cell transistor is judged to be in the excess-write state. In this case, no read currents flow from the cell transistor into a corresponding bit line BLi. This shows by definition that the read data is a logic "1." Accordingly, while all the cell transistors in NAND cell unit MUi are read out sequentially, if a "1" appears on bit line BLi, it should be determined that an excess-written cell transistor still exists among the memory cells. In other words, an excess-written cell transistor can be found by monitoring the generation of "1" on bit line BLi. If "1" does not appear on bit line BLi, all the cell transistors are judged to pass the upper-limit verify test, wherein their threshold voltages remain lower in potential than the upper-limit of the reference region. At this time, the verify-termination detector 40 generates the verify-termination signal with logic "1" in response to the output of comparator 32. The second write-verify process for the selected NAND cell unit MUi is thus terminated. Now, the threshold voltages of all the cell transistors of NAND cell unit MUi are verified to successfully fall within the reference region.

The above combination of the first and second write-verify processes will be similarly applied to the remaining NAND cell units MU2, ..., MUn in the selected cell block of EEPROM 10; it will be repeated until all the NAND cell units in the selected block are successfully verified to satisfy reference threshold-voltage region. The application scheme of the main voltages to the main components of EEPROM 10 during the repeat of the write-verify operations are summarized in TABLE 2 presented below.

TABLE 2

|  | ERASE | ERASE-VERIFY | WRITE "1" | WRITE "0" | 1ST VERIFY | 2ND VERIFY |
| --- | --- | --- | --- | --- | --- | --- |
| Vbit | — | 1.5V | 10V | 0V | 1.5V | 1.5V |
| Vsg1 | 0V* | 5V | 10V | 10V | 5V | 5V |
| Vcg2 | 0V | 0V | 10V | 10V | 5V | 5V |
| Vcg3 | 0V | 0V | 20V | 20V | 1.5V | 3.5V |
| Vcg4 | 0V | 0V | 10V | 10V | 5V | 5V |
| Vcg5 | 0V | 0V | 10V | 10V | 5V | 5V |
| Vcg6 | 0V | 0V | 10V | 10V | 5V | 5V |
| Vcg7 | 0V | 0V | 10V | 10V | 5V | 5V |
| Vcg8 | 0V | 0V | 10V | 10V | 5V | 5V |
| Vsg2 | 0V | 5V | 0V | 10V | 5V | 5V |
| Vs | — | 0V | 0V | 0V | 0V | 0V |

TABLE 2-continued

|  | ERASE | ERASE-VERIFY | WRITE "1" | WRITE "0" | 1ST VERIFY | 2ND VERIFY |
|---|---|---|---|---|---|---|
| Vsub | 20V | 0V | 0V | 0V | 0V | 0V |

Where, the mark "—" is used to indicate an electrically "floating" state. Note that the "0V" of Vsg1 during the erase period (labeled "*") may be set at 20V, if a P-type well region is arranged in an N-type substrate instead of P-type substrate 44; this is also true for the tables presented later.

The execution order of the second write-verify operation may be slightly modified such that the second write-verify operation is performed after the write (program) operations and the first write-verify operations therefor have been completed with respect to all the NAND cell units MU included in the selected cell block. The main voltages generated at the main components of EEPROM 10 during several operation modes is summarized in TABLE 3 shown below.

TABLE 3

|  | ERASE | ERASE-VERIFY | WRITE "1" | WRITE "0" | 1ST VERIFY | 2ND VERIFY |
|---|---|---|---|---|---|---|
| Vbit | — | 1.5V | 10V | 0V | 1.5V | 1.5V |
| Vsg1 | 0V | 5V | 10V | 10V | 5V | 5V |
| Vcg2 | 0V | 0V | 10V | 10V | 5V | 3.5V |
| Vcg3 | 0V | 0V | 20V | 20V | 1.5V | 3.5V |
| Vcg4 | 0V | 0V | 10V | 10V | 5V | 3.5V |
| Vcg5 | 0V | 0V | 10V | 10V | 5V | 3.5V |
| Vcg6 | 0V | 0V | 10V | 10V | 5V | 3.5V |
| Vcg7 | 0V | 0V | 10V | 10V | 5V | 3.5V |
| Vcg8 | 0V | 0V | 10V | 10V | 5V | 3.5V |
| Vsg2 | 0V | 5V | 0V | 10V | 5V | 5V |
| Vs | — | 0V | 0V | 0V | 0V | 0V |
| Vsub | 20V | 0V | 0V | 0V | 0V | 0V |

Note that, in the case of TABLE 3, the circuitry of FIG. 7 should be slightly modified so that (1) the two-input NAND gate G5 is removed causing the write-verify signal W-VERIFY2 to be directly supplied to inverter 12, and (2) two-input NAND gate G3 is replaced with a three-input NAND gate having a third input for receiving the write-verify signal W-VERIFY2 in addition to two inputs for read signal READ and address ai(bar).

It may possibly occur that, even after the first and second write-verify operations are repeated for a predetermined time, one or more memory cell transistors (insufficient-written or excess-written cell transistors) still remain with their resultant threshold voltages being out of the reference region, that is, the verify process is completed unsuccessfully. If this is the case, the selected cell block will be prohibited from being accessed in any manner. Such prohibition is generally expressed as the "protection" procedure in the semiconductor memory art. A read operation of EEPROM 10 is essentially similar to those of the conventional EEPROMs of the same type.

Practically, there may be several ways to perform the combination of the first and second write-verify operations. Some typical examples will be discussed below by presenting five major process flows. The first one is shown in the flowchart of FIG. 12, wherein the first and second write-verify operations are executed with respect to each of the word lines WL in the selected cell block.

Figure 12:
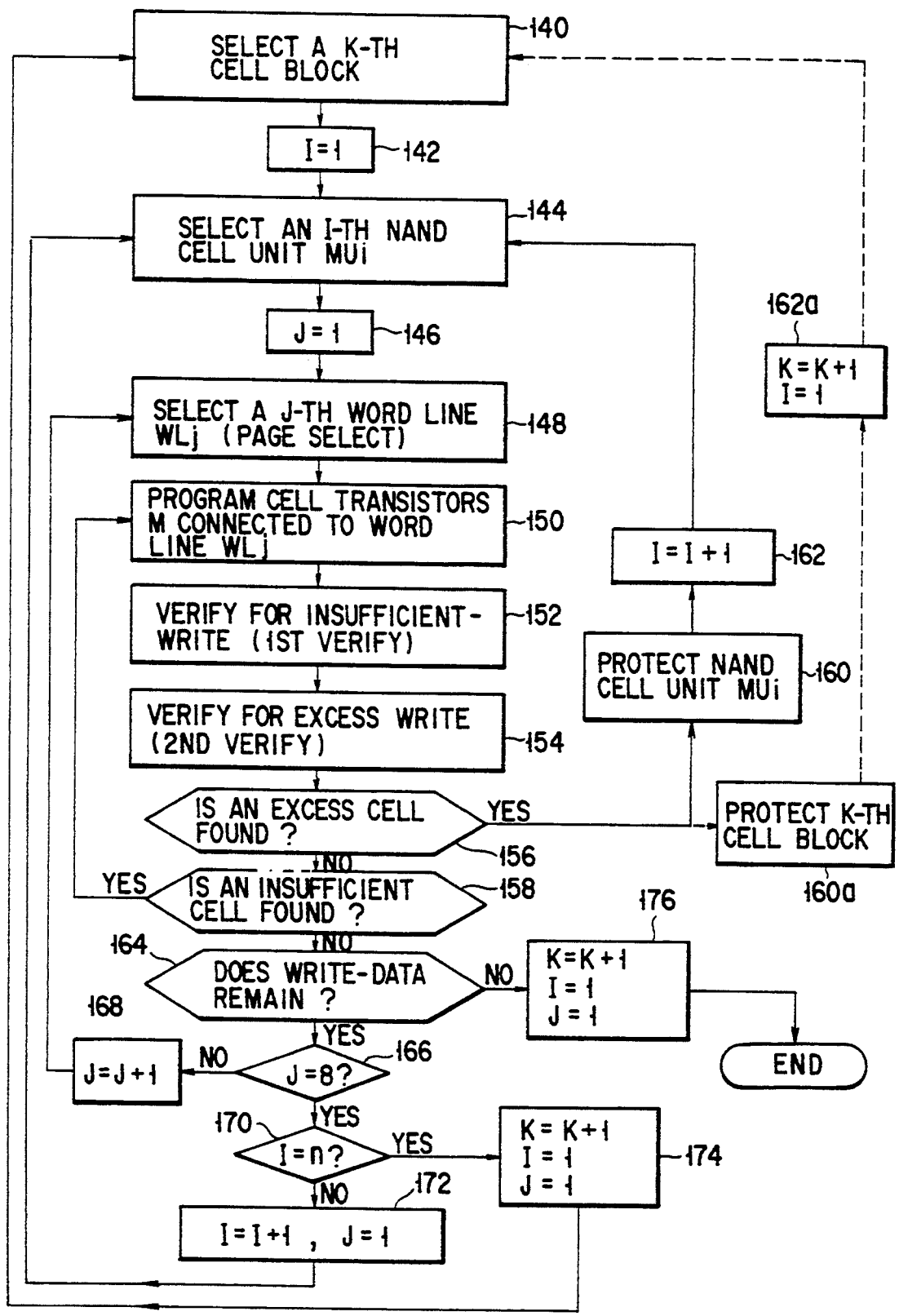

More specifically, at step 140 of FIG. 12, a certain cell block is selected in EEPROM 10. Assume that the k-th cell block is selected. When the parameter I of NAND cell unit is specified as 1 at step 142, a corresponding NAND cell unit MU1 is selected at step 144. When the word line number J is specified as 1 at step 146, a corresponding word line W11 is then selected at step 148. A corresponding one-page is now designated. At step 150, memory cell transistors M11, M21, . . . , Mn1, which are connected with the selected word line W11 to constitute the one-page, are programmed or written with data bits that are supplied by bit lines BL associated therewith.

Subsequently, at step 152 of FIG. 12, the first write-verify operation is performed for the selected page. More specifically, a read operation for the first write-verify (insufficient-write verify) is performed by applying the selected word line WL1 with the first verify voltage Vver1 in the manner as previously described. Thereafter, at step 154, the second verify voltage Vver2 is applied to word line WL1, and a read operation for the second verify (excess-write verify) is performed. During these steps, the non-selected word lines WL2 to WL8 are applied with the power-supply voltage Vcc.

At step 156 of FIG. 12, verification is done to determine whether or not any excess-written cell transistor remains. If the verify result is "NO," the process goes on to step 158, wherein a further verify is made to determine whether or not any insufficient-written cell transistor remains. If the verify result is "YES" at step 156, the process returns to stem 150. By performing steps 150,152,154 again, a rewrite (additional write or reprogram) operation is executed. A similar judgment is made at steps steps 156, 158. Such process flow will be repeated until "NO" appears at step 158, which means that no insufficient-written cells are found.

While the write-verify operations are being repeated, a "YES" may occur at step 156. If this is the case, the process goes to step 160. In this step, the presently selected NAND cell unit MU1 is "protected" and assigned as an unable-to-recover unit that will be prohibited from being accessed again. After parameter I is increased or "incremented" by one at step 162, the process then returns to step 144. In other words, the NAND cell unit MU1 is substantially abandoned (virtually removed from the effective NAND cell units) from that point on, and the process continues to a write-verify stage for the next NAND cell unit MUi+1 (=MU2, in this case). Note that, at step 160, the protection procedure may be made to the selected cell block itself, rather than the NAND cell unit MU1 at step 160. If this is the case, the process flow is modified as follows: At step 162, the parameter K is incremented by one, whereas the parameter I is kept unchanged; also, the process returns not to step 140 but to step 144. Such sub-routine flow modified is visualized by blocks 160a, 162a linked by a broken line in FIG. 12. The two possible modifications may be freely employed in accordance with the end user's preference. The above can be similarly applied to the rest of the embodiments that will presented below, although a similar visualization is omitted from their corresponding flowchart diagrams only for the purposes of illustration.

When "NO" is output at each of steps 156, 158 of FIG. 12, in other words, when all the cell transistors in the selected NAND cell unit MU1 have passed the first and second verify tests due to the fact that their actual threshold voltages correctly fall within the reference region, it is determined out at step 164 whether any write-data to be programmed remains with respect to the selected NAND cell unit. If "YES," inspection is then made at step 166 to determine whether or not the parameter J has already reached 8 (this number indicates the number of all cell transistors arranged in NAND cell unit MUi; see FIG. 2). If the output of step 166 is "NO," the parameter J is set to J=J+1 at step 168, and then the process returns to step 148. On the other hand, if the output of step 166 is "YES," examination is then made to determine whether or not parameter I reaches n (this number designates the number of bit lines BL; see FIG. 2). If "NO" appears to indicate that I is less than n, the process returns to step 144 after I is incremented by one, and J is set to J=1 at step 172. At step 170, if "YES" appears, the process goes to step 174, wherein the block number K is incremented by one, while I=J=1. Thereafter, the process returns to step 140. After the above process flow is repeated, if the output of step 164 becomes "NO," a similar operation to that of step 174 is performed at step 176. Then, the process is terminated. Note, in FIG. 12, that the execution order of steps 156,158 may be switched.

A write-verify process flow shown in FIG. 13 is featured in that, with respect to the selected NAND cell unit MUi, the insufficient-write verify tests are executed first, and the excess-write verify tests are executed thereafter. The process of FIG. 13 is similar to that shown in FIG. 12 in the performance of steps 140 to 150. After the data write operation is performed to the selected page at step 150, the process goes to step 180, wherein verification is done by applying the selected word line with the first verify voltage Vver1 to determine if any insufficient-written cell transistor remains in the selected page. Step 180 may correspond to step 158 of FIG. 12. If "YES" at step 180, the process returns to step 150. If "NO" at step 180, the process goes to step 182, wherein J is incremented by one. At step 184, inspection is made to determine if K has already reached 8. If K<8, the output of step 184 is "NO." At this time, the process returns to step 148.

After the steps 148, 150, 180, 182 of FIG. 13 have been repeated, if "NO" appears at step 184, more specifically, when it is successfully verified that any insufficient-written cell transistor is absent within the selected page, the process goes to step 186. At this step, the same NAND cell unit is now set in the excess-write verify stage for verifying whether or not any excess-written cell transistor remains within the selected page. This step is similar to the step 156 of FIG. 12 in that the second verify voltage Vver2 is applied to the selected word line. If "YES" is generated at step 186, the process will return to stem 144 by way of steps 160, 162, which may be replaced with steps 160a, 162a shown in FIG. 12 as previously described. If "NO" at step 186, the process returns to step 144 through steps 164, 170 and also step 188 for incrementing I by one (I=I+1).

A write-verify process flow shown in FIG. 14 is featured in that, each time an insufficient-write verify test is completed for the selected NAND 10 cell unit MUi, the excess-write verify test will immediately follow. The process of FIG. 14 is similar to that of FIG. 13 in the execution of steps 140 to 150, and 180. At step 180, the selected page is subjected to a similar sufficient-write verify operation to determine if any insufficient-written cell transistor remains within the selected page. If no such cell transistors are found, the process then goes to step 186, wherein the second verify voltage Vver2 is applied to the same word line WLj while the non-selected word lines are applied with the power-supply voltage Vcc, thereby to perform an excess-write verify test. If an excess-written cell transistor is found, the process returns to step 144 by way of steps 160, 162. If such cell transistor is not found, the process goes on to step 164, which has been already explained with reference to FIG. 13. If "YES" at step 164, steps 168, 166 are executed in this order. If "NO" at step 166, the process returns to step 144 through step 172. If "YES" appears at step 170, the process returns to step 140 via step 174.

Figure 15:
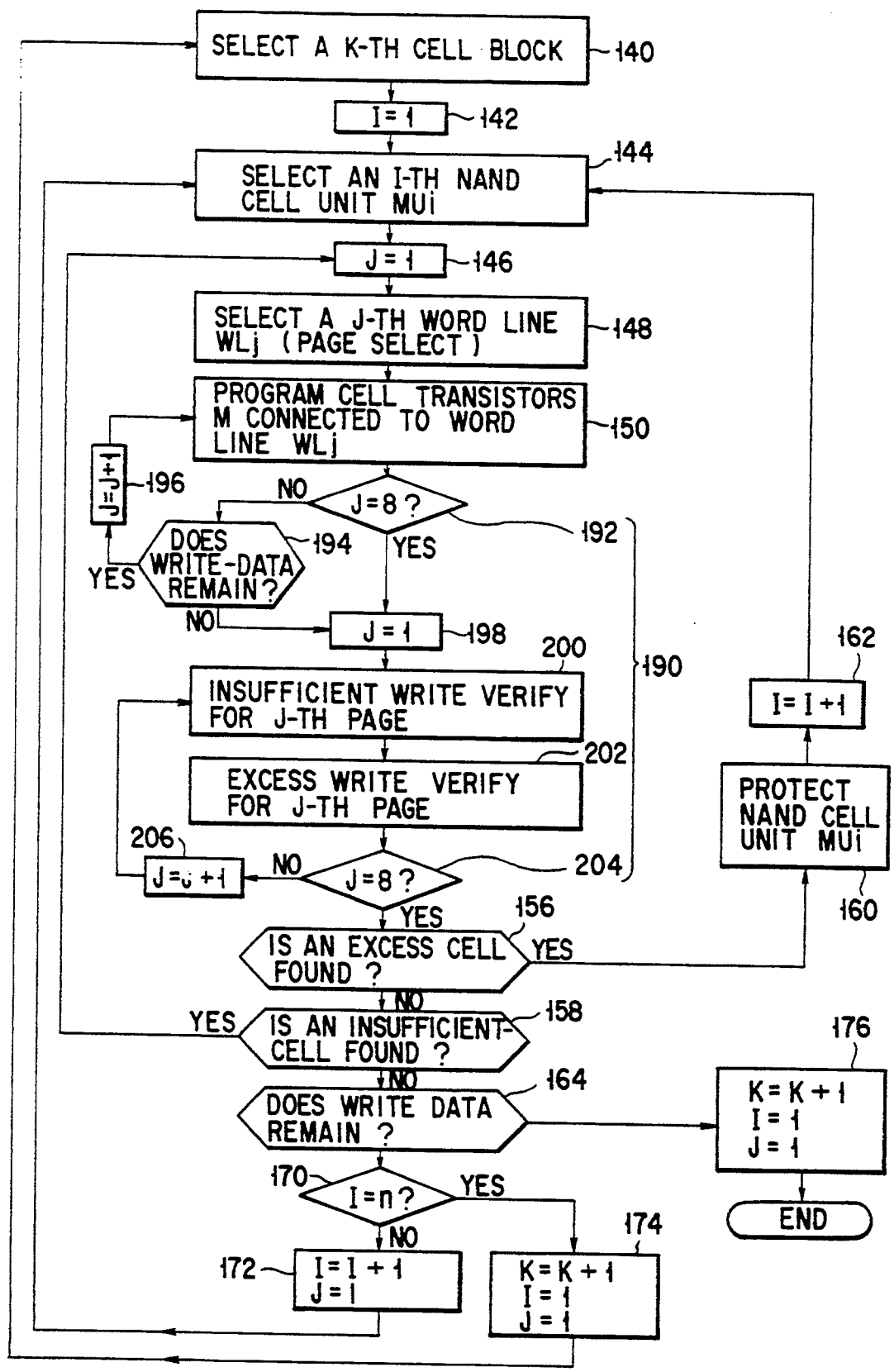

Principally, a process flow shown in FIG. 15 is similar to that of FIG. 12 with a sub-process 190 being added thereto, wherein, after step 150, the word lines WL1-WL8 associated with the selected NAND cell unit MUi are selected sequentially, and the combination of the insufficient-write verify and excess-write verify operations are performed with respect to each of these word lines.

More specifically, at step 192 of FIG. 15, verification is made to determine if the word line number J—which may also be interpreted to indicate the selected page number—reaches 8. If J<8, examination is done at step 194 to determine whether or not any further data to be written remains with respect to the selected page. If "YES," J is set to J+1 at step 196; then, the process returns to step 150. If "NO" at step 194, the process goes to step 198, wherein J is initialized to 1. The process also goes directly to this step 198 when "YES" appears at step 192, in other words, when J reaches 8.

Subsequently, at step 200 of FIG. 15, an insufficient-write verify test is executed with respect to the selected J-th page. This test is similar to the step 152 of FIG. 12 in that the first verify voltage Vver1 is applied to the J-th word line WLj. Then, at step 202, the same page is subjected to an excess-write verify test procedure. This test is similar to the step 154 of FIG. 12 in that the second verify voltage Vver2 is applied to the J-th word line WLj. At step 202, it is verified whether or not J reaches 8. If "NO"/J<8), J is set to J+1 at step 206, and then the process returns to step 200. If "YES" (J=8), the process goes to step 156 described above. The process flow that comes next is generally similar to the corresponding part shown in FIG. 12. Note that, in FIG. 15, the step 166 between steps 164 and 170 of FIG. 12 is no longer required.

The process of FIG. 15 may be modified as shown in FIG. 16. The process of FIG. 16 is similar to that shown in FIG. 15 with step 202 being replaced with step 154 of FIG. 12, which is executed between steps 158 and 156 as shown in FIG. 16. This means that the excess-write verify for the selected NAND cell unit MUi is permitted to begin only after the insufficient-write verify operations are sequentially performed by sequentially selecting word lines WL (pages) associated with the NAND cell unit and by applying thereto the first verify voltage Vver1.

The EEPROM 10 can provide higher operating reliability due to the "insufficient-write/excess-write verify combination" feature using the the first and second verify voltages Vver1, Vver2. This suggests that, even if the resulting threshold voltages after programming are varied among the memory cell transistors M due to the deviation in the manufacturing process of the highly-integrated NAND type EEPROMs, such physical variations can be "absorbed" or compensated for successfully to exhibit higher accessing reliability. It is thus possible to moderate the strict requirements for manufacture—which are becoming increasingly severe as the integration density increases—required of the semiconductor manufacturers. Such moderation of requirements will lead to improvement in the manufacturing yield of EEPROMs.

Furthermore, the above "insufficient-write/excess-write verify combination" feature can permit each programming time to become shorter; therefore, it is possible to prevent more successfully the memory cell transistors from rushing into the excess-write state, which makes them unable to recover. Using the shortened programming period, even if an insufficient-written cell transistor occurs, such cell transistors can be easily "rescued" by subsequent reprogram operations with the minimized risk and the maximized probability of success. This can facilitate or accelerate the threshold voltages of cell transistors once programmed to fall within the allowable variation range (which tends to be designed narrower to compensate for deviations in the manufacturing process) at higher probability. Attention should be paid to the fact that, even when an excess-written cell transistor occurs, the EEPROM can remain still usable by "protecting" only a part of the memory cell array including such cell transistor, which part may be either a NAND cell unit or a cell block containing this cell unit, although the former is more preferable than the latter since higher efficiency may be expected. Therefore, it is possible to minimize the risk of losing the entire memory space of EEPROM.

In addition, since the preferred embodiment is arranged to perform the erase-verify operation during the simultaneous erase mode before the program mode, the memory cell transistors once erased can be forced to uniformly maintain their threshold voltages at lower levels before the program operation begins. Such uniformity of lowered threshold voltage tendency provides the following unexpected results: The read speed of logic "0" data can be improved; and the cell transistors can be suppressed or prevented from becoming too high in their threshold voltages (rushing into the excess-written state) when programing of logic "1" data.

The above description of EEPROM 10 has been made under an assumption that the circuitry for achieving the "insufficient-write/excess-write verify combination" function is constituted by the internal circuitry that is mounted on chip substrate 44. Such arrangement, however, is not so essential in the reduction to practice of the present invention. The circuitry may be arranged in a separate IC chip. In such a case, when the invention is applied to an IC card module that includes a plurality of NAND type EEPROMs and is employed as an external storage unit for a digital computer system, only one IC chip can be used for these EEPROMs as a common controller therefor. This may simplify the IC card in structure.

Additionally, the voltage application scheme shown in TABLE 3 may be modified as shown in TABLE 4 below.

TABLE 4

|  | ERASE | ERASE-VERIFY | WRITE "1" | WRITE "0" | 1ST/2ND VERIFY |
|---|---|---|---|---|---|
| Vbit | — | 1.5V | 10V | 0V | 1.5V |
| Vsg1 | 0V | 5V | 10V | 10V | 5V |
| Vcg2 | 0V | 0V | 10V | 10V | 3.5V |
| Vcg3 | 0V | 0V | 20V | 20V | 1.5V |
| Vcg4 | 0V | 0V | 10V | 10V | 3.5V |
| Vcg5 | 0V | 0V | 10V | 10V | 3.5V |
| Vcg6 | 0V | 0V | 10V | 10V | 3.5V |
| Vcg7 | 0V | 0V | 10V | 10V | 3.5V |
| Vcg8 | 0V | 0V | 10V | 10V | 3.5V |
| Vsg2 | 0V | 5V | 0V | 10V | 5V |
| Vs | — | 0V | 0V | 0V | 0V |
| Vsub | 20V | 0V | 0V | 0V | 0V |

The voltage application scheme of TABLE 4 is similar to that of TABLE 3 with the two different (first and second) write-verify processes being replaced with a single "common" write-verify process, wherein the voltages Vcg2, Vcg4–Vcg8 applied to non-selected word lines WL2, WL4–WL8 are 3.5 volts, rather than 5-volt in TABLE 3, while a selected word line WL3 is applied with a 1.5-volt voltage (Vcg3). In this case, the circuitry shown in FIG. 7 is slightly rearranged such that (1) the two-input NAND gate G5 is supplied at its one input with address ai(bar) rather than ai, and at the other input with a common write-verify control signal W-VERIFY rather than signal W-VERIFY2, (2) the first write-verify signal W-VERIFY is replaced with the common write-verify signal W-VERIFY, and (3) two-input NAND gate G3 is replaced with a three-input NAND gate having a third input for receiving the common write-verify signal W-VERIFY in addition to two inputs for read signal READ and address ai(bar). With such an arrangement, the total length of time period required to complete the first and second write-verify operations may be decreased and thus improve the access speed of EEPROM 10.

The present invention may also be applicable to various types of EEPROMs other than the NAND type EEPROM 10. For example, the write-verify concept of the invention is applicable to an EEPROM including a memory cell array arranged as shown in FIG. 17. This EEPROM is known as the "NOR-cell type EEPROM" among those skilled in the memory art. The rest of the description will be devoted to the explanation of this device.

The typical arrangement of memory cells of the NOR type EEPROM is shown in FIG. 17, wherein the memory cells may include rows and columns of twin insulated-gate field effect transistors, which may be FATMOS transistors M. Bit lines BL are associated with the columns of memory cell transistors M. The rows of transistors M are connected at their control gate electrodes to control gate lines (word lines) CG. Select lines S are connected to the array of memory cell transistors M at the remaining source-drain connection nodes as illustrated in FIG. 17.

As shown in FIG. 18, the threshold-voltage distribution of the previously describer NAND-type EEPROM 10 in the erase mode is represented by the inner region of a line 210; the threshold-voltage distribution thereof in the write (program) mode is indicated by the inner region of a line 212. More specifically, to provide higher accessing reliability, the threshold voltage of each cell transistor in the erase mode should be required to fall within a specific range in the negative polarity area lower than zero volts (lower half region of FIG. 18). In the program mode, by contrast, the threshold voltage of each cell transistor should be required to fall within a limited region of positive polarity (recall the fact that the allowable variation range is defined between 1.5 to 3.5 volts in the previous embodiment). On the other hand, with the NOR-type EEPROM of FIG. 17, the threshold-voltage distributions during the erase and program modes are required to be included within the different regions in the positive polarity area, i.e., inside the internal regions of lines 214, 216, respectively. When the "insufficient-write/excess-write verify combination" concept of the present invention is applied to the NOR type EEPROM, the inherent difference of the NOR type EEPROM from NAND type EEPROM 10 in the threshold voltage characteristics will require some slight modifications that are described below.

The aforesaid write-verify process (such as steps 152, 154 shown in FIG. 12) using the first and second write-verify voltages Vver1, Vver2 is utilized for an erase-verify operation in the NOR type EEPROM of FIG. 17. Simultaneously, if necessary, the erase-verify process of the invention may be employed as a write-verify process of the NOR type EEPROM. In this case, a third voltage is used as the reference verify voltage; typically, the third voltage may be 5.5 volts when the first and second "erase" verify voltages are 4.5 volts and 0.5 volts respectively in the NOR type EEPROM. The practical process flow of the first and second eraseverify processes in the NOR type EEPROM may be arranged similarly as in the examples shown in FIGS. 12–16. Their basic principle lied behind them is same as that of the above-described NAND type EEPROM 10.

The present invention is not limited to the above-described specific embodiments, and may be practiced in a number of different ways without departing from the spirit or scope thereof.

What is claimed is:

1. A method for verifying an electrically erasable and programmable read only memory, said memory being divided into a plurality of memory cell blocks each including a plurality of cell units, each unit having a predetermined number of series-connected memory cell transistors, said method comprising the steps of:
   (a) applying a first reference voltage to one of the memory cell transistors and a second reference voltage to each of the remaining memory cell transistors so as to check whether a first threshold voltage of said one of the memory cell transistors is greater than the first reference voltage and the first reference voltage is lower than the second reference voltage;
   (b) selecting a second memory cell transistor after step (a); and
   (c) applying the first reference voltage to said second memory cell transistor next to said one of the memory cell transistors and the second reference voltage to each of the remaining memory cell transistors so as to check whether a second threshold voltage of said second memory cell transistor is greater than the first reference voltage and said first threshold voltage of said one of the memory cell transistors is lower than the second reference voltage.

2. A device for verifying an electrically erasable and programmable read only memory, said memory being divided into a plurality of memory cell blocks each including a plurality of cell units, each unit having a predetermined number of series-connected memory cell transistors, said device comprising:
   means for applying a first reference voltage to one of the memory cell transistors and a second reference voltage to each of the remaining memory cell transistors;
   means for checking whether a first threshold voltage of said one of the memory cell transistors is greater than the first reference voltage and the first reference voltage is lower than the second reference voltage;
   means for selecting a second memory cell transistor after checking whether the first threshold voltage of said one of the memory cell transistors is greater than the first reference voltage and the first reference voltage is lower than the second reference voltage;
   means for applying the first reference voltage to said second memory cell transistor next to said one of the memory cell transistors and the second reference voltage to each of the remaining memory cell transistors; and
   means for checking whether a second threshold voltage of said second memory cell transistor is greater than the first reference voltage and said first threshold voltage of said one of the memory cell transistors is lower than the second reference voltage.

* * * * *

UNITED STATES PATENT AND TRADEMARK OFFICE
CERTIFICATE OF CORRECTION

PATENT NO. : 5,386,422
DATED : January 31, 1995
INVENTOR(S) : Tetsuo ENDOH, et al.

It is certified that error appears in the above-indentified patent and that said Letters Patent is hereby corrected as shown below:

On the title page, Item [63], the Related U.S. Application Data should read:

--Continuation of Ser. No. 851,286, Mar. 12, 1992, Pat. No. 5,321,699--

Signed and Sealed this

Second Day of May, 1995

Attest:

BRUCE LEHMAN

*Attesting Officer*  *Commissioner of Patents and Trademarks*